(12) United States Patent
Kasano et al.

(10) Patent No.: US 8,218,395 B2
(45) Date of Patent: Jul. 10, 2012

(54) MOVING OBJECT DETECTING APPARATUS

(75) Inventors: Fumihiro Kasano, Osaka (JP); Susumu Katayama, Osaka (JP); Toru Mugiuda, Osaka (JP); Kazushi Goto, Osaka (JP); Hidehiko Fujikawa, Osaka (JP); Motohiro Minamino, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/328,086

(22) Filed: Dec. 16, 2011

(65) Prior Publication Data

US 2012/0087210 A1    Apr. 12, 2012

Related U.S. Application Data

(63) Continuation of application No. PCT/IB2010/001445, filed on Jun. 16, 2010.

(30) Foreign Application Priority Data

Jun. 18, 2009 (JP) ................................. 2009-145759
Dec. 15, 2009 (JP) ................................. 2009-284403
Dec. 15, 2009 (JP) ................................. 2009-284404
Dec. 15, 2009 (JP) ................................. 2009-284405

(51) Int. Cl.
*G01S 15/58* (2006.01)
(52) U.S. Cl. ........................................................ 367/90
(58) Field of Classification Search .............. 367/87, 367/90, 94
See application file for complete search history.

(56) References Cited

U.S. PATENT DOCUMENTS

| 3,942,178 | A | * | 3/1976 | Hackett ........................... 367/93 |
| RE30,288 | E | * | 5/1980 | Hackett ........................... 367/94 |
| 4,287,579 | A | * | 9/1981 | Inoue et al. ..................... 367/94 |
| 4,459,689 | A | * | 7/1984 | Biber ............................... 367/93 |
| 7,746,220 | B2 | | 6/2010 | Takagi et al. |
| 2010/0052972 | A1 | | 3/2010 | Kasano et al. |

FOREIGN PATENT DOCUMENTS

| JP | 61184481 | 8/1986 |
| JP | 61246686 | 11/1986 |
| JP | 6298281 | 5/1987 |
| JP | 6348487 | 3/1988 |
| JP | 323380 | 1/1991 |
| JP | 2001235538 | 8/2001 |
| JP | 200420486 | 1/2004 |

(Continued)

OTHER PUBLICATIONS

The International Search Report.

*Primary Examiner* — Daniel Pihulic
(74) *Attorney, Agent, or Firm* — Bacon & Thomas, PLLC

(57) ABSTRACT

A moving object detecting apparatus includes: a transmitting/receiving unit for radiating an ultrasonic wave and receiving a reflective wave reflected from an object present in a monitoring space; a phase detection circuit for mixing reference signals with a reflective signal and obtaining a pair of Doppler signals each having an amplitude depending on a phase difference from the reference signal, each of the Doppler signals having a different phase from each other; a rotation angle calculation unit for calculating a rotation angle; a cumulative addition unit for accumulating the rotation angle; and a comparison unit for comparing the accumulated rotation angle with a threshold value. In the moving object detecting apparatus, a single ultrasonic vibrator is commonly used in the transmitting unit and the receiving unit.

20 Claims, 16 Drawing Sheets

FOREIGN PATENT DOCUMENTS

| | | |
|---|---|---|
| JP | 2006266740 | 10/2006 |
| JP | 2007183182 | 7/2007 |
| JP | 2008151506 | 7/2008 |
| JP | 200998038 | 5/2009 |
| JP | 200998098 | 5/2009 |
| JP | 2011127926 A * | 6/2011 |
| JP | 2011127927 A * | 6/2011 |
| JP | 2011127928 A * | 6/2011 |

* cited by examiner

MOVING OBJECT DETECTING APPARATUS

This application is a Continuation Application of PCT International Application No. PCT/IB2010/001445 filed on Jun. 16, 2010, which designated the United States.

FIELD OF THE INVENTION

The present invention relates to a moving object detecting apparatus for detecting the presence of an object moving in a monitoring space by radiating continuous energy waves such as ultrasonic waves, radio waves, or the like to the monitoring space and detecting a frequency deviation in waves reflected from the object moving within the monitoring space, the frequency deviation being caused due to the motion of the object.

BACKGROUND OF THE INVENTION

Recently, motor vehicle theft and on-board thefts of vehicles have increased, and a burglar alarm system in a vehicle that goes off loudly when a suspicious person intrudes a vehicle that is parked has been widely used. The burglar alarm system for a vehicle includes a moving object detecting apparatus for detecting an existence of a moving object (or person) in a monitoring space around a vehicle (see, e.g., Japanese Patent Application Publication No. 2008-151506).

FIG. 17 shows an example of a conventional moving object detecting apparatus described in the above Patent. In the patent, a transmitter 1003 is driven by a transmission signal of a certain frequency (i.e., an oscillation frequency) at which an oscillation circuit 101 oscillates, and radiates an ultrasonic wave of the same frequency as the oscillation frequency of the oscillation circuit 1 into a monitoring space. A receiver 1004 receives a reflective ultrasonic wave from an object O present in the monitoring space. The receiver 1004 converts the received reflective wave into a reception signal Ein, and the reception signal Ein is inputted to each of first and second phase detection circuits (mixers) 106A and 106B and mixed with reference signals E03 and E04 having the same frequency as the oscillation frequency of the oscillation circuit 1, respectively.

FIGS. 18A to 18C show waveform views of the transmission signal E01, and the reference signals (mixer signals) E03 and E04, respectively. The reference signal E04 equals to the transmission signal E01 and, therefore, the reference signal E04 and the transmission signal E01 are in phase.

Meanwhile, the reference signal E03 is based on a signal having a phase delayed from that of the transmission signal E01 by 90 degrees ($\pi/2$) by a phase-shifting circuit 110 and, therefore, the reference signals E03 and E04 are out of phase. Thus, the phases of a pair of Doppler signals E1 and E2 outputted as a beat signal from the first and second mixer circuits 106A and 106B are different from each other. The pair of Doppler signals E1 and E2 are amplified by first and second amplifying circuits 113A and 113B, respectively, and then inputted to a signal processing unit 108.

In the signal processing unit 108, a sampling circuit 185 samples the pair of Doppler signals E1 and E2 at a predetermined sampling frequency and quantizes the sampled signals to convert an analog value into a digital value. The converted digital values are sequentially stored in a non-volatile memory 181. Here, assuming that a digital value (digital data) converted from the Doppler signal E1 by the sampling circuit 185 is $X_n$, and a digital value (digital data) converted from the Doppler signal E2 by the sampling circuit 185 is $Y_n$ (where n is a positive integer), a vector $R_n$ is defined in which the origin of a two-dimensional orthogonal coordinate system serves as a starting point and $(X_n, Y_n)$ serves as an ending point. Also, the magnitude of the vector $R_n$ depends on amplitudes of the Doppler signals E1 and E2.

Further, a vector rotation angle calculation circuit 186 of the signal processing unit 108 calculates an angle $\Phi_n$ (hereinafter, referred to as "a rotation angle of the vector") between a vector $R_{n-1}$ which has been obtained from an immediately previous sampling that was stored in the memory 181 and the vector $R_n$ obtained from the current sampling. The vector rotation angle calculation circuit 186 calculates the rotation angle $\Phi_n$ by the following equation:

$$\Phi_n = \arctan\{(X_{n-1}Y_n - Y_{n-1}X_n)/(X_{n-1}X_n + Y_{n-1}Y_n)\} \qquad \text{Eq. (1)}$$

Thus, when the object O approaches the detecting apparatus, the vector $R_n$ rotates counterclockwise and a polarity of the rotation angle $\Phi_n$ becomes positive. Further, when the object O moves away from the detecting apparatus, the vector $R_n$ rotates clockwise and the polarity of the rotation angle $\Phi_n$ becomes negative.

The rotation angle $\Phi_n$ obtained by the vector rotation angle calculation circuit 186 is added up (or integrated) by a cumulative addition unit 187, and the added value ($=\Phi_1 + \Phi_2 + \ldots + \Phi_n + \ldots$) is proportional to a movement distance of the object O. In the signal processing unit 108, the cumulative value added up by the cumulative addition unit 187 is compared with a threshold by a comparison unit 188. When the added value exceeds the threshold value, the comparison unit 188 outputs a detection signal. The detection signal is inputted to an alarm driving circuit 111 and, accordingly, the presence of the moving object O is appropriately notified by an alarm (not shown)

However, in the conventional example, since the transmitter 1003 for radiating ultrasonic waves is separated from the receiver 1004 for receiving reflective waves, it requires a large space to install the transmitter 1003 and the receiver 1004. Especially, when the transmitter 1003 and the receiver 1004 are separately installed in a vehicle, it is difficult to secure an installation place.

SUMMARY OF THE INVENTION

In view of the above, the present invention provides a moving object detecting apparatus capable of easily securing an installation place by reducing a space for installation. Further, the present invention provides a moving object detecting apparatus capable of reducing a blind spot by extending a monitoring space.

In accordance with a first aspect of the present invention, there is provided a moving object detecting apparatus, including: an oscillation unit for oscillating at a certain frequency; a transmitting unit for radiating an ultrasonic wave based on a transmission signal outputted from the oscillation unit into a monitoring space; a receiving unit for receiving a reflective wave as ultrasonic wave reflected from an object present in the monitoring space to output a reception signal; and a phase detection circuit for mixing reference signals each having the same frequency as that of the transmission signal and a different phase from that of the transmission signal with the reception signal and for obtaining a pair of Doppler signals each having an amplitude depending on a phase difference from the reference signal, each of the Doppler signals having a different phase from each other.

Further, the moving object detecting apparatus includes: a rotation angle calculation unit for calculating a rotation angle at which a vector having the origin as a starting point and a numerical value of an amplitude level of the pair of Doppler signals as an ending point in a two-dimensional orthogonal coordinate system rotates with time; a cumulative addition unit for accumulating the rotation angle calculated by the rotational angle calculation unit; and a comparison unit for comparing the accumulated value of the rotation angle accumulated by the cumulative addition unit with a threshold value. In the moving object detecting apparatus, a single ultrasonic vibrator is common to the transmitting unit and the receiving unit.

With the above configuration, since a single ultrasonic vibrator is commonly used by the transmission unit and the reception unit, the apparatus can be made compact compared to the conventional example in which each of the transmission unit and the reception unit has an ultrasonic vibrator. As a result, a moving object detecting apparatus which can easily secure an installation place by reducing the space for installation can be provided.

The phase detection unit may include an input terminal to which a reception signal is inputted; an output terminal from which a Doppler signal is outputted; a reference signal input terminal to which a reference signal is inputted; and a field effect transistor (FET) inserted between a signal line connecting the input terminal and the output terminal and a ground, having a gate to which the reference signal input terminal is connected.

With this configuration, the influence of the transmission signal on the reception signal can be reduced with a simple configuration.

Further, the phase detection unit may include a first detection block including an input terminal to which a reception signal is inputted, an output terminal from which a Doppler signal is outputted, a reference signal input terminal to which a reference signal is inputted, and a field effect transistor inserted between a signal line connecting the input terminal and the output terminal and a ground, having a gate to which the reference signal input terminal is connected; a second detection block including an input terminal to which a reception signal is inputted, an output terminal from which a Doppler signal is outputted, a reference signal input terminal to which a reference signal is inputted, and a field effect transistor inserted between a signal line connecting the input terminal and the output terminal and a ground, having a gate to which the reference signal input terminal is connected through an inverter; and a differential amplifier for differentially amplifying the Doppler signal outputted from the output terminal of the first detection block and the Doppler signal outputted from the output terminal of the second detection block.

With this configuration, the influence of the transmission signal on the reception signal can be reduced with no attenuation of a Doppler signal, with a simple configuration.

Furthermore, the phase detection unit may include an input terminal to which a reception signal is inputted; an output terminal from which a Doppler signal is outputted; a reference signal input terminal to which a reference signal is inputted; an operational amplifier having one input end connected to the ground during a positive period in which the reference signal input terminal has a positive polarity to the ground, and connected to receive the reception signal during a negative period in which the reference signal input terminal has a negative polarity to the ground; an input resistor inserted between the input terminal and the one input end of the operational amplifier; a feedback resistor inserted between an output end of the operational amplifier and the other input end of the operational amplifier; and a low pass filter inserted between the output terminal and the output end of the operational amplifier.

With this configuration, the influence of the transmission signal on the reception signal can be reduced without attenuation of a Doppler signal, with a simple configuration.

The transmitting unit may include an inverter which inverts the transmission signal outputted from the oscillation unit; and a serial circuit of a condenser and a resistor inserted between an output end of the inverter and one input end of the ultrasonic vibrator, wherein the receiving unit obtains a reception signal from the one input end of the ultrasonic vibrator.

Further, the transmitting unit may include an inverter which inverts a transmission signal outputted from the oscillation unit; a condenser inserted between an output end of the inverter and one input end of the ultrasonic vibrator; and a resistor inserted between the other input end of the ultrasonic vibrator and the ground, wherein the receiving unit obtains a reception signal from the other input end of the ultrasonic vibrator.

The moving object detecting apparatus may further include a phase-shifting unit for generating a reference signal by shifting a phase of the transmission signal outputted from the oscillation unit.

With this configuration, since the transmission signal is used as the signal source of a reference signal, a noise component is easily prevented from overlapping with the transmission signal outputted from the oscillation unit.

Preferably, the moving object detecting apparatus may include a buffer amplifier inserted between the receiving unit and the phase detection unit.

With this configuration, it is possible to improve the transmission efficiency of signal transmitted from the reception unit to the phase detection unit.

Further, it is preferred that the buffer amplifier has a function of a filter for allowing only a frequency of ultrasonic wave to pass therethrough.

In accordance with the invention of claim 9, a harmonic noise overlapping with the reception signal outputted from the reception unit can be removed.

In accordance with a second aspect of the present invention, there is provided a moving object detecting apparatus including: an oscillation unit for oscillating at a certain frequency; a transmitting/receiving unit for radiating an ultrasonic wave based on a transmission signal outputted from the oscillation unit into a monitoring space and receiving a reflective wave reflected from an object present in the monitoring space to output a reception signal; a difference output unit for outputting a difference between a signal inputted to the transmitting/receiving unit and a signal outputted from the transmitting/receiving unit; and a phase detection unit which mixes reference signals each having a different phase from each other at the same frequency as that of the transmission signal with a signal outputted from the difference output unit and obtains a pair of Doppler signals each having an amplitude depending on a phase difference from the reference signal and a different phase from each other.

Further, the moving object detecting apparatus includes: a rotation angle calculation unit for calculating a rotation angle at which a vector having the origin as a starting point and a numerical value of an amplitude level of the pair of Doppler signals as an ending point in a two-dimensional orthogonal coordinate system, rotates with time; a cumulative addition unit for accumulating the rotation angle calculated by the rotational angle calculation unit; and a comparison unit for comparing the accumulated value of the rotation angle accumulated by the cumulative addition unit with a threshold value.

With this configuration, the transmitting/receiving unit performs a transmission as well as a reception. Thus, a signal in which a power noise of an element for driving the transmitting/receiving unit overlaps with the transmission signal is inputted, and a signal in which the noise-overlapping transmission signal is added by the reception signal is outputted.

However, since the difference output unit outputs a difference between a signal inputted to the transmitting/receiving unit and a signal outputted from the transmitting/receiving unit, and, accordingly, the reception signal without the power noise and the transmission signal are inputted to the phase detection unit. Therefore, it is possible to increase an amplification factor for amplifying an output of the phase detection unit. Consequently, a monitoring space of the moving object detecting apparatus can be extended or enlarged, and, as a result, a blind spot of the moving object detecting apparatus can be reduced.

In accordance with a third aspect of the present invention, there is provided a moving object detecting apparatus including: an oscillation unit for oscillating at a certain frequency; a transmitting/receiving unit for radiating an ultrasonic wave based on a transmission signal outputted from the oscillation unit into a monitoring space and receiving a reflective wave reflected from an object present in the monitoring space as a reception signal; a phase detection unit which mixes reference signals each having a different phase from each other and the same frequency as that of the transmission signal with the reception signal and obtains a pair of Doppler signals each having an amplitude depending on a phase difference from the reference signal and a different phase from each other; and a rotation angle calculation unit for calculating a rotation angle at which a vector having the origin as a starting point and a numerical value of an amplitude level of the pair of Doppler signals as an ending point in a two-dimensional orthogonal coordinate system, rotates with time.

The moving object detecting apparatus further includes a cumulative addition unit which accumulates the rotation angle calculated by the rotational angle calculation unit; and a comparison unit which compares the accumulated value of the rotation angle accumulatively added up by the cumulative addition unit with a threshold value, wherein the transmitting/receiving unit includes a single ultrasonic vibrator common to transmission and reception; a gate IC which receives the transmission signal from the oscillation unit and inverts an output based on a level difference between the corresponding transmission signal and a threshold level; a condenser, for cutting a DC off, connected between an output end of the gate IC and the ultrasonic vibrator; an inverter driven by the same power as that of the gate IC, inverting an output from the gate IC; and an impedance element connected between an output end of the ultrasonic vibrator and an output end of the inverter, having the same impedance as that of a serial circuit of the condenser and the ultrasonic vibrator at a frequency of the transmission signal.

With this configuration, during a period in which an output from a gate IC is at a high level and an output from an inverter is at a low level, a transmission signal in which noise component of power overlaps is divided by a serial circuit of a condenser and an ultrasonic vibrator and an impedance element so as to be generated at an output terminal of the ultrasonic vibrator, and during a period in which an output from the gate IC has a low level and an output from the inverter has a high level, signal in which a noise component of power overlaps with a signal obtained by inverting the transmission signal is divided by an impedance element and a serial circuit of a condenser and an ultrasonic vibrator so as to be generated at an output terminal of the ultrasonic vibrator.

Here, since the serial circuit comprised of the condenser and the ultrasonic vibrator and the impedance element are set to have the same impedance at a frequency of the transmission signal, the transmission signal can be negated at the output terminal of the ultrasonic vibrator, and the voltage obtained by dividing the noise component is inverted from positive polarity to negative polarity at the frequency of the transmission signal. Thus, when a Doppler frequency of about 100 Hz generated due to a movement of a person is detected, the voltage obtained by dividing the noise component can be considered to be negated, and accordingly, when an output of the phase detection unit is amplified, an amplification factor can be set to have a higher value, whereby a monitoring space can be extended or enlarged, thus realizing a moving object detecting apparatus having a reduced blind spot.

In accordance with a fourth aspect of the present invention, there is provided a moving object detecting apparatus including: an oscillation unit which oscillates at a certain frequency; a transmission signal generation unit for generating a transmission signal based on an oscillation output from the oscillation unit; a transmitting/receiving unit for radiating an ultrasonic wave into a monitoring space, upon receiving driving power during a period in which the transmission signal is inputted, and receiving a reflective wave reflected from an object present in the monitoring space to convert the received reflective wave into an electrical signal; a mixer signal generation unit which generates a pair of reference signals each having a different phase from each other and the same frequency as that of the transmission signal; and a phase detection unit which mixes the pair of reference signals generated by the mixer signal generation unit with the reception signal and obtains a pair of Doppler signals each having an amplitude depending on a phase difference from the reference signal and a different phase from each other.

Further, the moving object detecting apparatus includes a rotation angle calculation unit for calculating a rotation angle at which a vector having the origin as a starting point and a numerical value of an amplitude level of the pair of Doppler signals as an ending point in a two-dimensional orthogonal coordinate system, rotates with time; a cumulative addition unit for accumulating the rotation angle calculated by the rotational angle calculation unit; and a comparison unit which compares the accumulated value of the rotation angle accumulatively added up by the cumulative addition unit with a threshold value, wherein the transmission signal generation unit and the mixer signal generation unit shift phases of the transmission signal and the reception signal, such that a period during which driving power is supplied to the transmitting/receiving unit based on the transmission signal, and periods during which the reception signal is mixed with the reference signals by the phase detection unit and outputted do not overlap on the time axis.

With the above configuration, the transmission signal generation unit and the mixer signal generation unit shift phases of the transmission signal and the reception signal, such that a period during which a driving power is supplied to the transmitting/receiving unit based on the transmission signal, and periods during which the reception signal is mixed with the reference signals by the phase detection unit and outputted, do not overlap on the time axis. Accordingly, while the phase detection unit mixes the transmission signal with each of the reference signals and outputs the pair of Doppler signals, no driving power is supplied to the transmitting/receiving unit.

Therefore, it does not happen that a noise component caused by the driving power overlaps with the pair of Doppler signals, and the reception signal without noise is outputted from the phase detection unit. Thus, it is possible to raise the amplification factor for amplifying an output from the phase detection unit. As a result, the monitoring space of the moving object detecting apparatus can be extended or enlarged, thereby reducing a blind spot of the moving object detecting apparatus.

BRIEF DESCRIPTION OF THE DRAWINGS

The above and other objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described in more detail with reference to accompanying drawings which form a part hereof.

(Embodiment 1)

Figure 1:
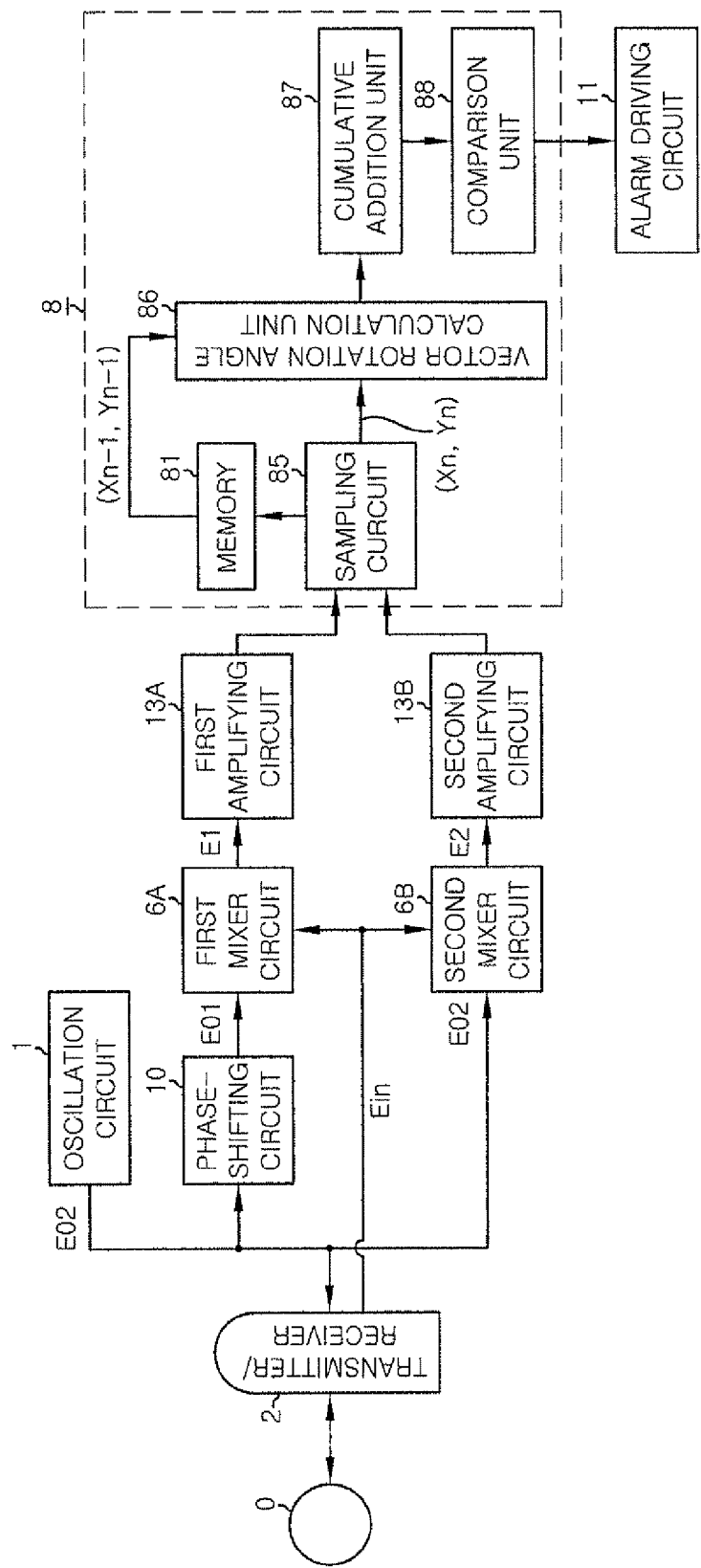
FIG. 1 is a block diagram showing a first embodiment of the present invention.
Figure 17:
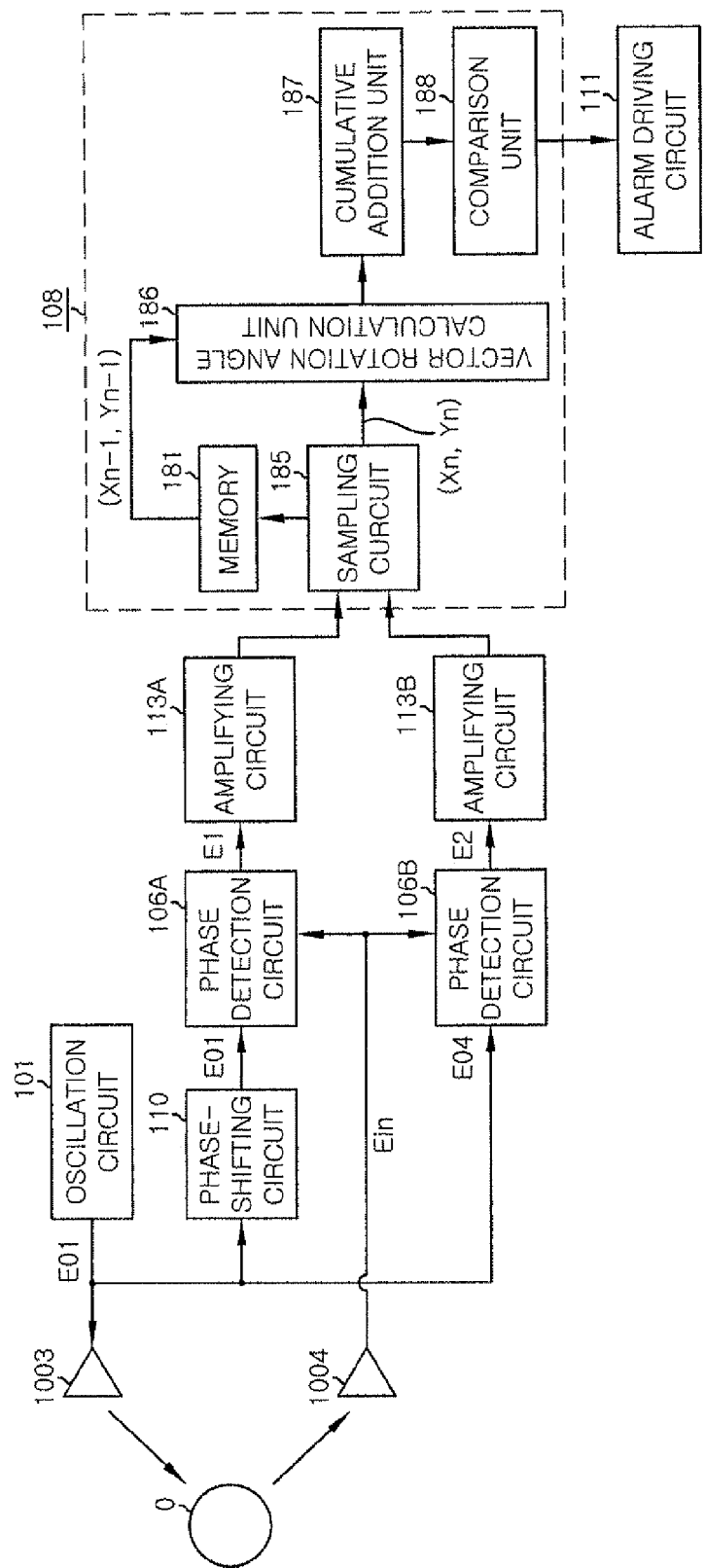
FIG. 17 is a view showing a conventional moving object detecting apparatus.

A block diagram of a moving object detecting apparatus in accordance with a first embodiment of the present invention is illustrated in FIG. 1. Herein, a basic configuration of the present embodiment is common with the conventional example illustrated in FIG. 17, and like reference numerals are used for the elements which are common with the conventional example and a description thereof is omitted.

Figure 2A:
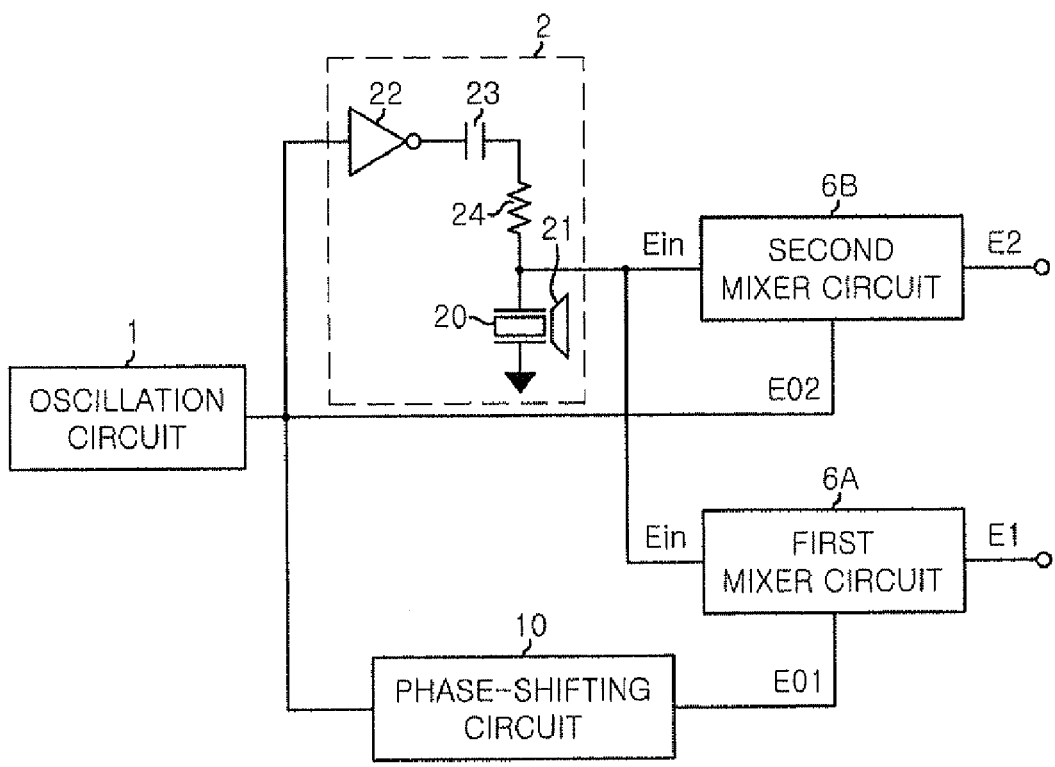
FIG. 2A is a schematic block diagram showing a specific configuration of a transmitter/receiver while omitting portions thereof in a moving object detecting apparatus shown in FIG. 1.

The moving object detecting apparatus in accordance with present embodiment features a transmitter/receiver 2 using a single ultrasonic vibrator in transmission and reception, instead of the transmitter 3 and the receiver 4. As shown in FIG. 2A, the transmitter/receiver 2 includes an ultrasonic vibrator 20, a horn 21 for regulating a transmission direction and a reception direction of ultrasonic waves, an inverter 22 inverting a transmission signal outputted from an oscillation circuit 1, and a serial circuit of a condenser 23 and a resistor 24 inserted between an output terminal of the inverter 22 and an input terminal of the ultrasonic vibrator 20.

The ultrasonic vibrator 20 is a known vibrator using a piezoelectric element; and one input terminal (output terminal) thereof is connected with the resistor 24 and the other input terminal (output terminal) is connected to a ground. A reception signal Ein is extracted from the output terminal connected with the resistor 24 and inputted to first and second phase detection circuits 6A and 6B, respectively.

Figure 2B:
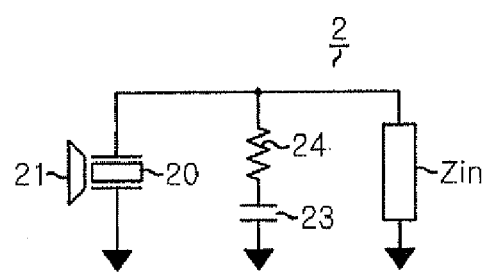
FIG. 2B is an equivalent circuit diagram of the transmitter/receiver.

Further, an output impedance of the inverter 22 is sufficiently small, such that an equivalent circuit of the transmitter/receiver 2 is denoted as a circuit in which the serial circuit of the resistor 24 and the condenser 23 and an input impedance Zin of the first and second phase detection circuits 6A and 6B are connected in parallel to the ultrasonic vibrator 20 (see FIG. 2B).

In the present embodiment, a signal source of a transmission signal and reference signals E01 and E02 is common, thereby removing the necessity of the high density oscillation circuit 1. The reason is as follows.

When there occurs a phase change in the oscillation circuit 1, the transmission signal Vosc=A·sin($\omega$0t+$\Phi$·sin $\omega$t), in which A is an amplitude, $\omega$0 is an angular speed of a transmission signal, $\Phi$ is an angle for a phase change, and $\omega$ is an angular speed of a phase change. As seen from the equivalent circuit shown in FIG. 2B, the transmission signal is divided by a voltage division ratio (=$\alpha$) of an impedance of the ultrasonic vibrator 20 and that of the serial circuit of the resistor 24 and the condenser 23, and overlaps the reception signal Ein. When $\Phi$<<1, cos $\Phi\approx$1 and sin $\Phi\approx\Phi$, the reception signal is obtained as follows:

$$Vosc=\alpha A(\sin \omega ot+\Phi\cdot\sin \omega t\cdot\cos \omega ot)=\alpha A\cdot\sin \omega ot+\alpha(\Phi A/2)\cdot\{\sin(\omega o+\omega)t-\sin(\omega o-\omega)t\}$$

Namely, as clarified from the second term at the right side of the above equation, frequency components of the sum of the frequency of the transmission signal and the frequency of a phase change and frequency components of the difference thereof are included in the reception signal Ein. If these frequency components are equal to the frequency of a Doppler signal, they become a noise.

However, in the present embodiment, since the signal source of the transmission signal and the reference signals E01 and E02 is common, the output from the first and second mixer circuits 6A and 6B is $\sin(\omega_o t+\Phi\cdot\sin\omega t)\cdot\sin(\omega_o t+\Phi\cdot\sin\omega t)=\{1-\cos 2(\omega_o t+\Phi\cdot\sin\omega t)\}/2$. When the double frequency component is removed by a low pass filter, only a DC component remains, thus removing noise.

Figure 3:
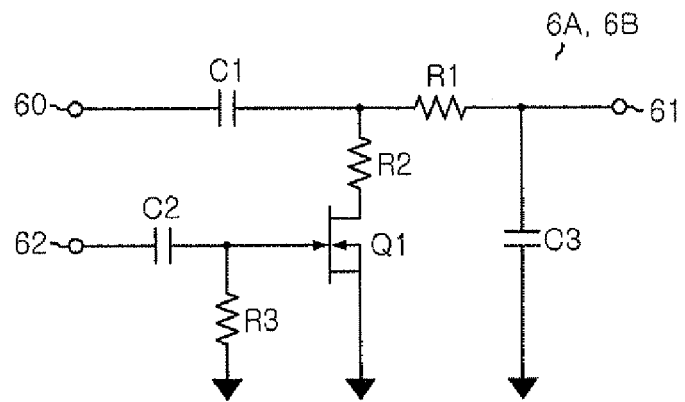
FIG. 3 is a circuit diagram of a phase detection circuit shown in FIG. 1.

In the present embodiment, as shown in FIG. 3, each of the mixer circuits 6A and 6B includes an input terminal 60 to which the reception signal Ein is inputted, an output terminal 61 from which a Doppler signal E1 or E2 is outputted, a reference signal input terminal 62 to which the reference signal E01 or E02 is inputted. Further, each of the mixer circuits 6A and 6B has a field effect transistor (FET) Q1 inserted between a signal line connecting the input terminal 60 and the output terminal 61 and a ground, the field effect transistor Q1 having a gate to which the reference signal input terminal 62 is connected.

In addition, condensers C1 and C2 for cutting a DC off are connected with the input terminal 60 and the reference signal input terminal 62, respectively. A resistor R3 for discharging is connected between the gate of the FET Q1 and the ground, and a resistor R2 is connected to a drain of the FET Q1. Further, a low pass filter (LPF) configured as an integration circuit of the resistor R1 and the condenser C3 is connected between the FET Q1 and the output terminal 61.

During a period (positive half-wave period) in which the reference signal E01 or E02 inputted to the reference signal input terminal 62 has a positive polarity with respect to the ground, the FET Q1 is turned on and a signal line between the input terminal 60 and the output terminal 61 is short-circuited, such that the Doppler signal E1 or E2 is not outputted to the output terminal 61. During a period (negative half-wave period) in which the reference signal E01 or E02 has a negative polarity to the ground, the FET Q1 is turned off and the signal line between the input terminal 60 and the output terminal 61 is not short-circuited, and the Doppler signal E1 or E2 is outputted to the output terminal 61.

In operation, when a phase difference between the reference signal E01 or E02 and the reception signal Ein is n) (=180°, a signal is outputted to the output terminal 61 only during the period in which the reception signal Ein has a positive polarity with respect to the ground. In this case, when the amplitude of the reception signal Ein is A, a signal having a voltage level of $A/\pi$ is outputted to the output terminal 61. Meanwhile, when a phase difference between the reference signal E01 or E02 and the reception signal Ein is 0 or $2n\pi$ (where n=1, 2, ... ), a signal is outputted to the output terminal 61 only during a period in which the reception signal Ein has a negative polarity with respect to the ground. In this case, when the amplitude of the reception signal Ein is A, a signal having a voltage level $-A/\pi$ is outputted to the output terminal 61.

Further, in other cases than the cases in which the phase difference between the reference signal E01 or E02 and the reception signal Ein is $\pi$ or $2n\pi$ (where n=0, 1, 2, ... ), a signal having a voltage level within a range of $-A/\pi \sim A/\pi$ is outputted to the output terminal 61. Namely, when the reference signal E01 or E02 and the reception signal Ein have different frequencies, the Doppler signal E01 or E02 whose phase difference changes in a range of $0 \sim 2\pi$ is outputted with a frequency of the frequency difference from the output terminal 61.

Here, the transmission signal outputted from the oscillation circuit 1 overlaps with the reception signal Ein. Since the transmission signal has the same frequency as that of the reference signal E01 or E02, a frequency component which is double the frequency of the reference signal E01 or E02 and a DC component can be obtained through mixing. Preferably, the former frequency component is removed by a low pass filter and the latter DC component is removed by positioning a condenser for cutting a DC current off at a next stage of the mixer circuits 6A and 6B.

Conventionally, a time for transmitting ultrasonic waves from the transmitter and a time for receiving reflective waves at the receiver are time-divided in order to prevent the transmission signal from overlapping with the reception signal. However, in the present embodiment, as described above, the influence of the transmission signal on the reception signal Ein can be restrained, and therefore, the transmission and reception of ultrasonic waves can be performed simultaneously or in parallel.

Figure 4A:
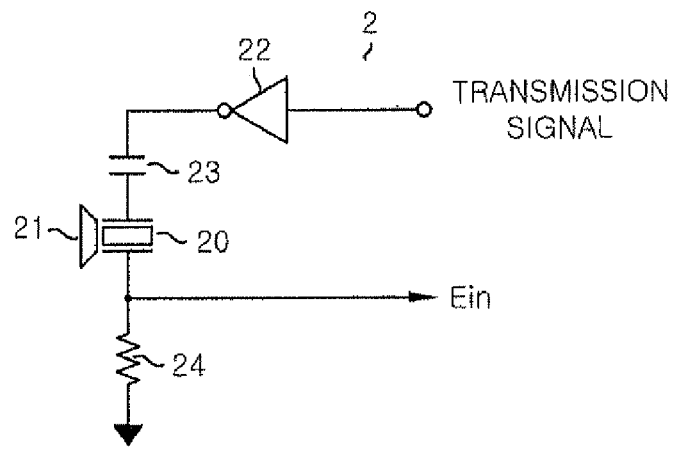
FIGS. 4A and 4B represent a circuit diagram and an equivalent circuit diagram of another configuration of the transmitter/receiver shown in FIG. 1, respectively.

Referring to FIG. 4A, the transmitter/receiver 2 may have a configuration in which the ultrasonic vibrator 20 is connected between the condenser 23 and the resistor 24 connected in series to the output terminal of the inverter 22 and the reception signal Ein is obtained from the output terminal connected with the resistor 24 and inputted to the first and second mixer circuits 6A and 6B.

Figure 4B:
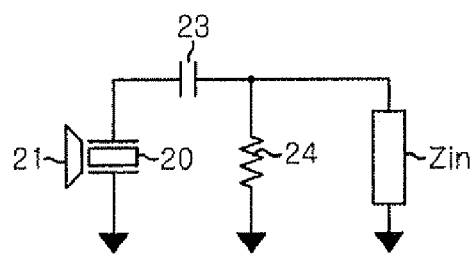

Also, since an output impedance of the inverter 22 is sufficiently small, the transmitter/receiver 2 is expressed as an equivalent circuit in which the serial circuit of the resistor 24 and the condenser 23 is connected in parallel to the ultrasonic vibrator 20 and the input impedance Zin of the first and second mixer circuits 6A and 6B is connected in parallel to the resistor 24 (see FIG. 4B).

If the output impedance of the transmitter/receiver 2 and the input impedance of the first and second mixer circuits 6A and 6B are approximately equal, it can be difficult to effectively transfer the reception signal Ein, and also, the two mixer circuits 6A and 6B may interfere with each other. Thus, preferably, a buffer amplifier 7 is inserted between the transmitter/receiver 2 and the first and second mixer circuits 6A and 6B.

Figure 5:
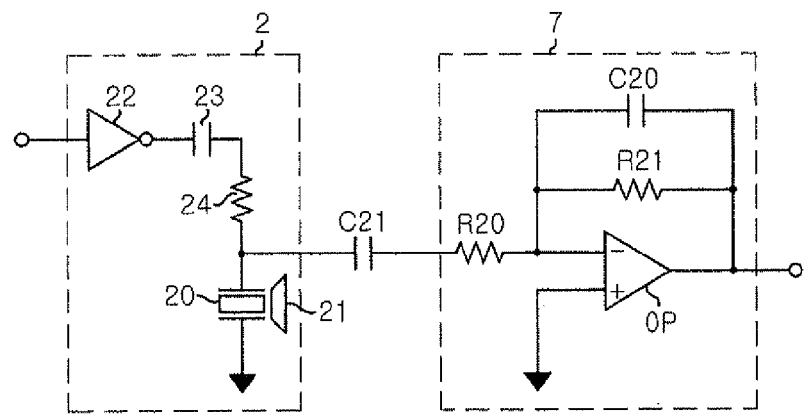
FIG. 5 shows a circuit configuration diagram for explaining another example including the transmitter/receiver.

For example, as shown in FIG. 5, the buffer amplifier may include an integrator (low pass filter) having an operational (OP) amplifier OP, input resistors R20 and R21, and a condenser C20. With this configuration, a harmonic component contained in square waves of the transmission signal can be prevented from overlapping with the reception signal Ein. Also, the buffer amplifier 7 is connected with the transmitter/receiver 2 through the condenser 21 for cutting a DC current.

As described above, in accordance with the present embodiment, since the transmitter/receiver 2 uses a single ultrasonic vibrator 20 common in transmission and reception, the size can be reduced in comparison to the conventional example in which each of the transmitter 3 and the receiver 4 uses a different ultrasonic vibrator. As a result, it is possible to scale down the size of the moving object detecting apparatus to reduce the installation space in comparison with the conventional apparatus, thereby providing a moving object detecting apparatus which can secure its installation place more easily.

(Embodiment 2)

The present embodiment features the configuration of the mixer circuits 6A and 6B and other configurations are common with Embodiment 1. Therefore, only the mixer circuits 6A and 6B, the characteristics of the present embodiment, will be described, and an illustration and description of the other configurations will be omitted.

Figure 6:
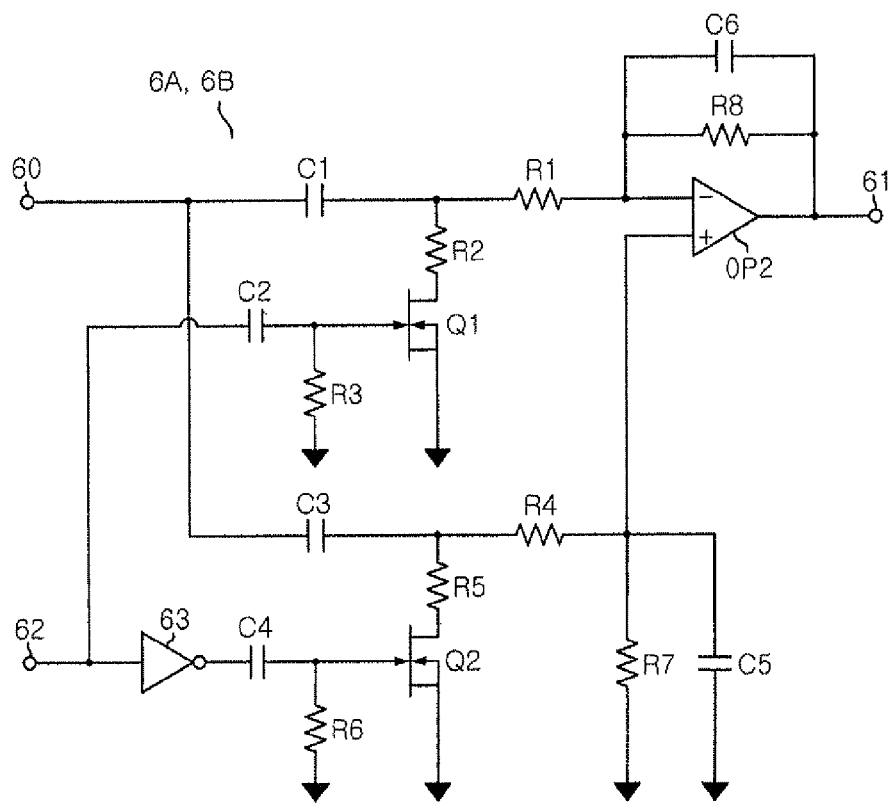
FIG. 6 is a circuit configuration diagram of a phase detection circuit in a moving object detecting apparatus in accordance with a second embodiment of the present invention.

In the present embodiment, as shown in FIG. 6, in the mixer circuits 6A and 6B, a second detection block having a common configuration to that of a part (first detection block) of the mixer circuits 6A and 6B described in Embodiment 1 is prepared in parallel to the input terminal 60 and the reference signal input terminal 62. In the second detection block, the reference signal E01 or E02 is inverted by an inverter 63 and inputted to a gate of the FET Q2 and outputs from the first and second detection blocks are differentially amplified by a differential amplifying unit. Further, the differential amplifying unit includes an OP amplifier OP2, resistors R1 and R8, and a condenser C6, and also serves as a low pass filter.

In the mixer circuits 6A and 6B of Embodiment 1, the level of the output signal (Doppler signal) is attenuated by $1/\pi(-10$ dB) of the level of the reception signal Ein. However, in the mixer circuits 6A and 6B of the present embodiment, a phase detection signal having the same phase as that of the reception signal Ein detected by the first detection block and a phase detection signal having a reverse phase of that of the reception signal Ein detected by the second detection block are differently amplified.

Thus, when the amplification degree of the differential amplifying unit is one-fold, double output (Doppler signal) can be obtained in comparison to Embodiment 1. Further, the amplification degree of the differential amplifying unit may be greater than one-fold as long as the output is not saturated. With the mixer circuits 6A and 6B of the present embodiment, even when the reception signal Ein having a large amplitude is inputted, since low frequency noise is cancelled in a differential amplifying unit, resistance to noise can be advantageously improved.

(Embodiment 3)

The present embodiment features the configuration of the mixer circuits 6A and 6B and other configurations are common with Embodiment 1. Therefore, hereinafter, only the mixer circuits 6A and 6B, the characteristics of the present embodiment, will be described, and an illustration and description of the other configurations will be omitted.

Figure 7:
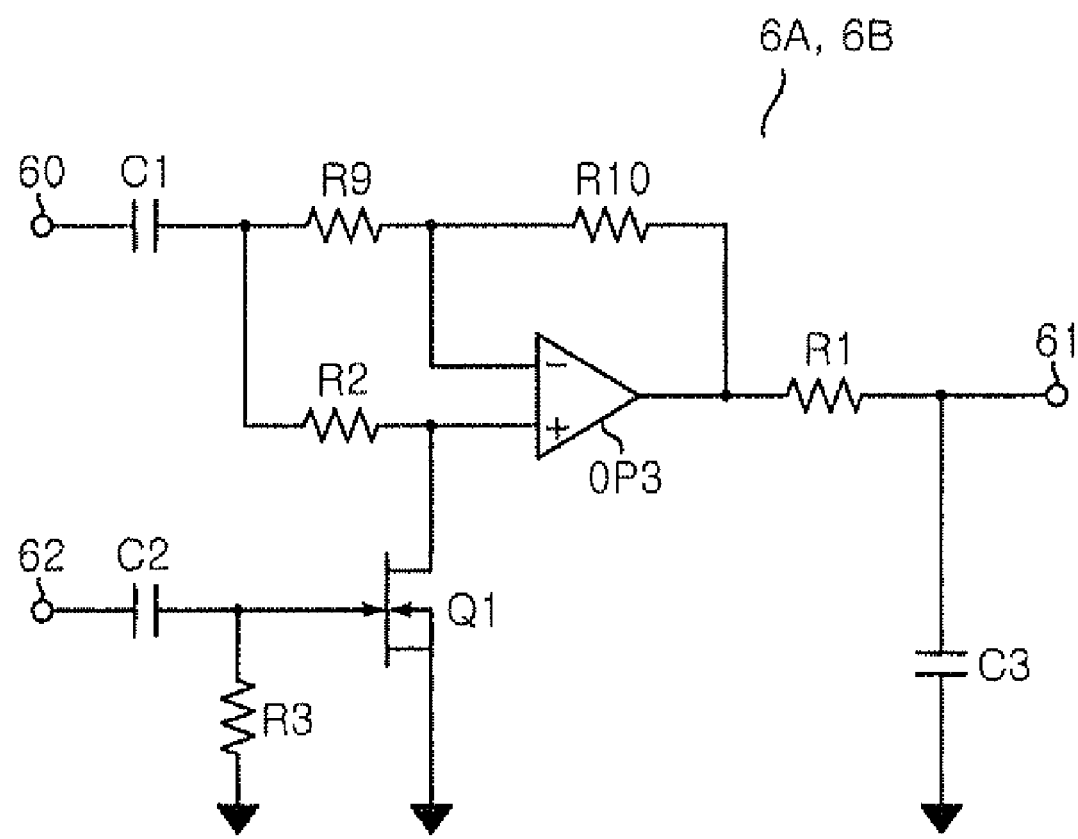
FIG. 7 is a circuit configuration diagram of a phase detection circuit in a moving object detecting apparatus in accordance with a third embodiment of the present invention.

In the mixer circuits 6A and 68 of the present embodiment, as shown in FIG. 7, a drain of the FET Q1 is connected with a non-inverting input terminal of an OP amplifier OP3, while an inverting input terminal of the OP amplifier OP3 is connected with a condenser C1 through a resistor R9. Further, an output terminal of the OP amplifier OP3 is connected with the output terminal 61 through a resistor R1, and a feedback resistor R10 is connected between the output terminal and the inverting input terminal of the OP amplifier OP3.

When a resistance value of the resistor R9 connected with the non-inverting input terminal is equal to that of the feedback resistor R10, the FET Q1 is turned on during a period (positive half-wave period) in which the reference signal E01 or E02 inputted to the reference signal input terminal 62 has a positive polarity with respect to the ground. Accordingly, the non-inverting input terminal of the OP amplifier OP3 is short-circuited to the ground, such that the OP amplifier OP3 operates as an inverting amplifier whose amplification degree is one-fold.

On the other hand, during the period (negative half-wave period) in which the reference signal E01 or E02 has a negative polarity with respect to the ground, the FET Q1 is turned off. Accordingly, the reception signal Ein is inputted to the non-inverting input terminal of the OP amplifier OP3, such that the OP amplifier OP3 operates as a non-inverting amplifier whose amplification degree is one-fold by combining the non-inverting amplifier whose amplification degree is two-fold and the inverting amplifier whose amplification degree is one-fold. As a result, the operations of the inverting amplification and non-inverting amplification are repeatedly performed at every half period of the reference signal E01 or E02. The resultant signal is averaged by the low pass filter connected with the output terminal of the OP amplifier OP3, thereby obtaining the Doppler signals E1 and E2 from the output terminal 61.

In the moving object detecting apparatuses of Embodiments 1 to 3 as described above, if a power source of the inverter for driving the ultrasonic vibrator includes a noise component, the noise component contained in the power source overlaps with the reception signal because the ultrasonic vibrator is common to a reception unit and a transmission unit. The noise component overlapped in the reception signal is also inputted to the amplifying circuits 13A and 13B through the mixer circuits 6A and 6B. This makes it difficult to increase an amplification factor of the amplifying circuits 13A and 13B. For that reason, it is impossible to widen a monitoring space.

(Embodiment 4)

Hereinafter, Embodiment 4 will be described with reference to FIGS. 8 and 9. A basic configuration and operation of a moving object detecting apparatus in accordance with the Embodiment 4 are the same as those of the moving object detecting apparatuses described in Embodiments 1 to 3, and a detailed description of the common parts will be omitted.

Figure 8:
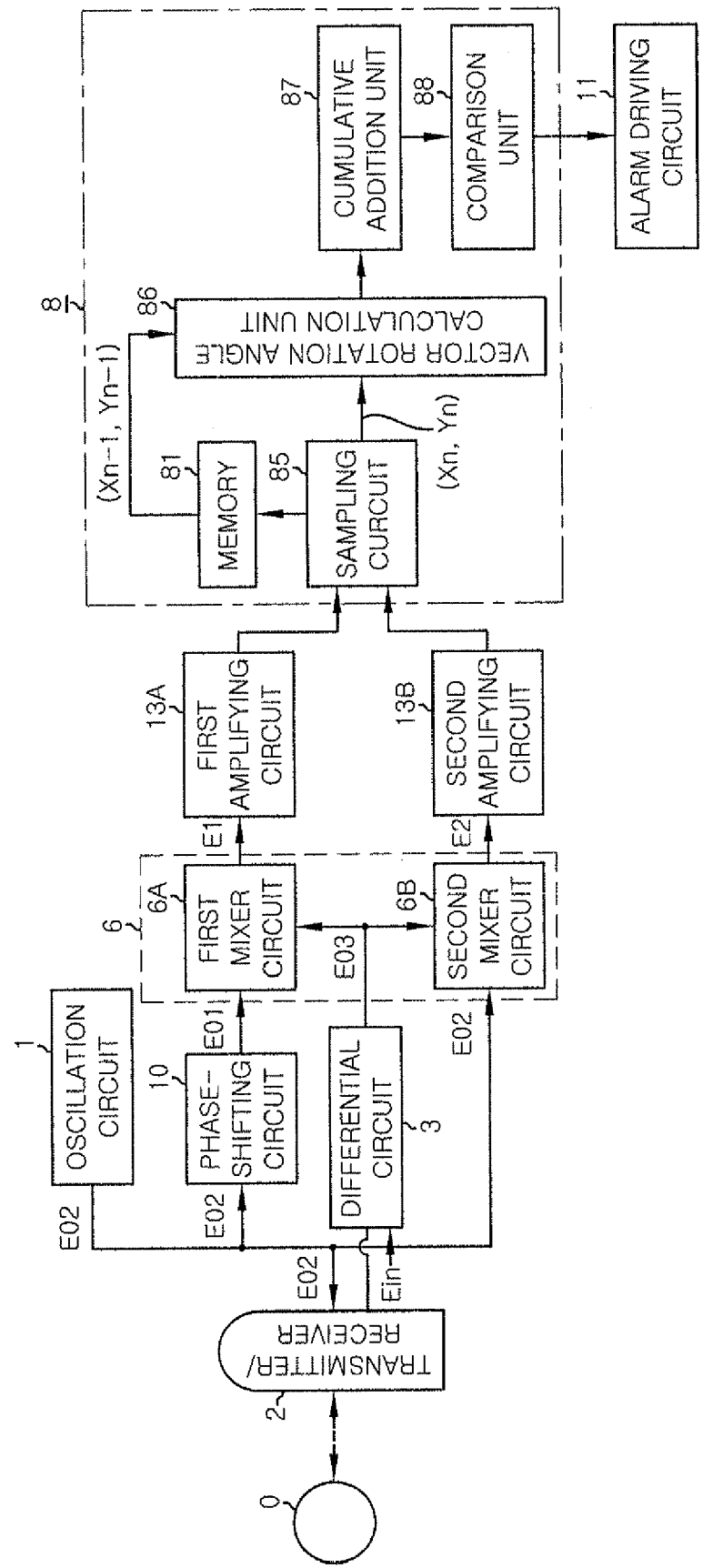
FIG. 8 is a block diagram illustrating a moving object detecting apparatus in accordance with a fourth embodiment of the present invention.

As shown in FIG. 8, the moving object detecting apparatus includes an oscillation circuit 1 (oscillation unit) for oscillating at a certain frequency, and a transmitter/receiver 2 (transmitting/receiving unit) for radiating ultrasonic waves based on a transmission signal E02 outputted from the oscillation circuit 1 to a monitoring space and receiving reflective waves reflected from an object present in the monitoring space. Further, the moving object detecting apparatus includes a phase-shifting circuit for generating a reference signal E01 obtained by delaying the phase of the transmission signal E02, and a differential circuit 3 (differential output unit) for outputting a difference signal E03, a difference between a signal inputted to the transmitter/receiver 2 and a signal outputted from the transmitter/receiver 2.

In addition, the moving object detecting apparatus includes a phase detection circuit 6 for mixing each of the reference signals E01 and E02 with the signal E03 outputted from the differential circuit 3, the reference signals E01 and E02 having a different phase from each other but the same frequency as that of the transmission signal E02. Thus, a pair of Doppler signals E1 and E2 having a phase different from each other and an amplitude depending on a different phase between the reference signals E01 and E02 is obtained. The moving object detecting apparatus further includes first and second amplifying circuits 13A and 13B for amplifying Doppler signals E1 and E2, respectively, and a signal processing unit 8 for determining the presence or absence of a moving object based on the Doppler signals E1 and E2 amplified by the first and second amplifying circuits 13A and 13B.

The phase detection circuit 6 includes a first mixer circuit 6A for mixing the reference signal E01 obtained by shifting the phase of the transmission signal E02 at the same frequency as that of the transmission signal E02 with the differential signal E03 outputted from the differential circuit 3, and a second mixer circuit 6B for mixing a reference signal formed of the transmission signal E02 with differential signal E03 outputted from the differential circuit 3.

In the present embodiment, one reference signal E01 is outputted from the phase shifting circuit 10, and there is a phase difference of a certain angle (e.g., 90 degrees) between the reference signals E01 and E02. Thus, the Doppler signals E1 and E2 obtained as bit signals from the outputs of the first and second mixer circuits 6A and 6B would have different phases. Further, the Doppler signals E1 and E2 are amplified by the amplifying circuits 13A and 13B, respectively, and then applied to the signal processing unit 8.

A detailed circuit diagram of each of the first and second mixer circuits 6A and 6B is as shown in FIG. 3, and a difference signal E03 from the differential circuit 3 is inputted to the input terminal 60, and the reference signals E01 and E02 are inputted to the input terminal 62.

The operation will now be described. When a phase difference between the reference signal E01 or E02 and the difference signal E03 is π (=180 degrees), a signal is outputted to the output terminal 61 only during the period in which the difference signal E03 has a positive polarity with respect to a ground. In this case, when the amplitude of the difference signal E03 is A, a signal having a voltage level of A/π is outputted to the output terminal 61.

Meanwhile, when a phase difference between the reference signal E01 or E02 and the difference signal E03 is 0 or 2nπ (where n=1, 2, . . . ), a signal is outputted to the output terminal 61 only during a period in which the difference signal E03 has a negative polarity with respect to the ground. When the amplitude of the difference signal E03 is A, a signal having a voltage level of −A/π is outputted to the output terminal 61. On the other hand, when a phase difference between the reference signal E01 or E02 and the difference signal E03 is other than π or 2nπ (where n=0, 1, 2, . . . ), a signal having a voltage level within a range of −A/π~A/π is outputted to the output terminal 61. Namely, when the frequencies of the reference signal E01 or E02 and the difference signal E03 are different from each other, the Doppler signal E1 or E2 whose phase difference is changed within the range of 0~2π at a differential frequency therebetween is outputted from the output terminal 61.

Further, the signal processing unit 8 includes a sampling circuit 85 for sampling and quantizing the first and second Doppler signals E1 and E2 which have been amplified by the first and second amplifying circuits 13A and 13B at a certain period. The sampling circuit 85 obtains values Xn and Yn (where n is a positive integer) by converting the Doppler signals E1 and E2 of analog values into digital values, respectively. A non-volatile memory 81 sequentially stores the digital values X and Y converted by the sampling circuit 85.

A vector rotation angle calculation unit 86 obtains a vector Rn having the origin as a starting point and the point (Xn, Yn) as an ending point in a two-dimensional orthogonal coordinate system and sequentially stores it in the memory 81. Further, the vector rotation angle calculation unit 86 calculates the angle $\Phi_n$ (hereinafter, referred to as "a rotation angle of vector") between a vector Rn-1 obtained from immediately previous sampling and stored in the memory 81 and the vector Rn obtained from the current sampling, by using the foregoing Eq. (1).

A cumulative addition unit 87 accumulates the vector rotation angle $\Phi_n$ calculated by the vector rotation angle calculation unit 86, and a comparison unit 88 compares the cumulative value $\Sigma\Phi_n$ accumulated by the cumulative addition unit 87 with a threshold value. Also, the signal processing unit 8 may be configured by using, for example, a microcomputer, and the microcomputer may execute a control program to realize the vector rotation angle calculation unit 85, the cumulative addition unit 87, and the comparison unit 88.

In operation, when a moving object approaches the detecting apparatus, the vector Rn rotates counterclockwise and, accordingly, the vector rotation angle $\Phi_n$, has a positive polarity. On the contrary, when the moving object moves away from the detecting apparatus, the vector Rn rotates clockwise, such that the vector rotation angle $\Phi_n$ has a negative polarity. The vector rotation angle $\Phi_n$ is accumulated by the cumulative addition unit 87, and the accumulated value (=$\Phi_1$+ $\Phi_2$+ . . . +$\Phi_n$+ . . . ) is proportional to a movement distance of the moving object.

Thus, when the accumulated value $\Sigma\Phi_n$ exceeds a threshold value, the comparison unit 88 outputs an object detection signal. The object detection signal is inputted to an alarm driving circuit 11, and the alarm driving circuit 11 notifies about the presence of the moving object by driving an alarm (not shown) such as a lamp, a buzzer, or the like.

Figure 9:
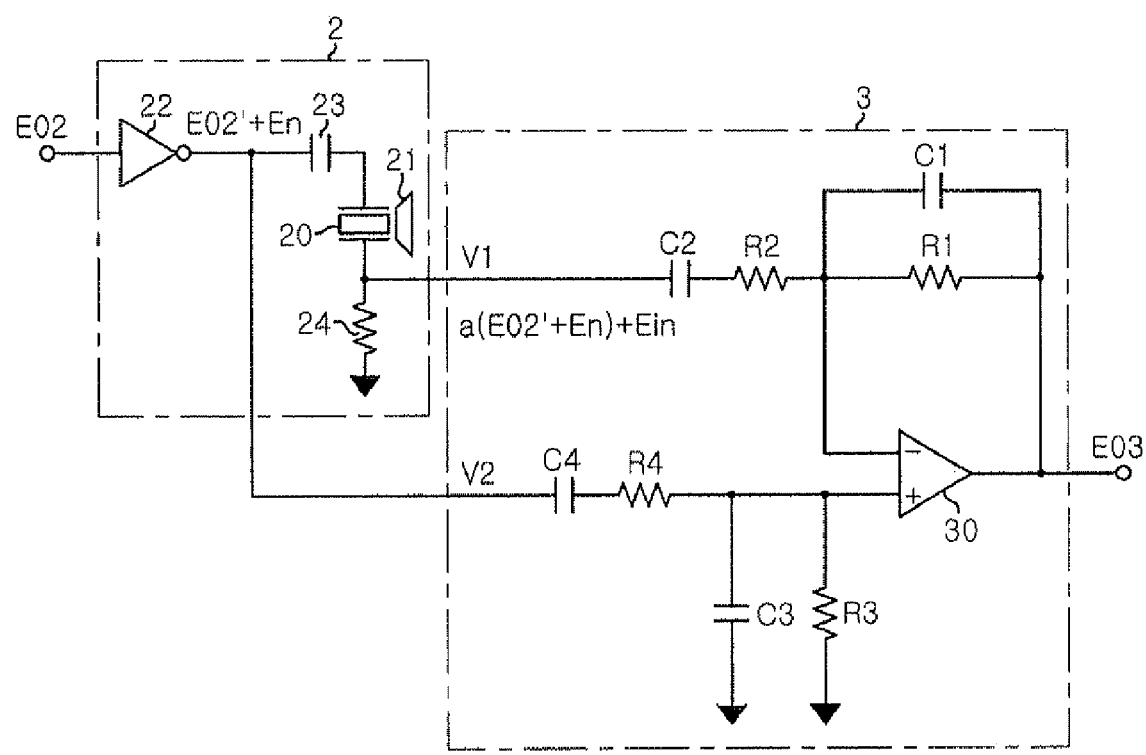
FIG. 9 is a detailed circuit diagram of a transmitter/receiver and a differential circuit in the moving object detecting apparatus in accordance with the fourth embodiment of the present invention.

As shown in FIG. 9, the transmitter/receiver 2 includes a single ultrasonic vibrator 20 common to transmission and reception and configured by using, for example, a piezoelectric element, a horn 21 for regulating a transmission direction and a reception direction of ultrasonic waves, and an inverter 22 for outputting a signal obtained by inverting high/low of the transmission signal E02 outputted from the oscillation circuit 1. Further, the transmitter/receiver 2 includes a condenser 23, for cutting a DC off, connected between an output terminal of the inverter 22 and the ultrasonic vibrator 20, and a resistor connected between an output terminal of a reception signal of the ultrasonic vibrator 20 and a ground.

The differential circuit 3 includes an OP amplifier 30, a serial circuit of a condenser C2 and a resistor R2 connected between an output terminal of the reception signal of the ultrasonic vibrator 20 and an inverting input terminal of the OP amplifier 30, and a parallel circuit of a condenser C1 and a resistor R1 connected between the inverting input terminal and an output terminal of the OP amplifier 30. Further, the differential circuit 3 includes a serial circuit of a condenser C4 and a resistor R4 connected between an output terminal of the inverter 22 and a non-inverting input terminal of the OP amplifier 30, and a parallel circuit of a condenser C3 and a resistor R3 connected between the non-inverting input terminal of the OP amplifier 30 and the ground.

In the present embodiment, when impedance of the serial circuit of the condenser C2 and the resistor R2 is Z1, impedance of the parallel circuit of the condenser C1 and resistor R1 is Z2, impedance of the serial circuit of the condenser C4 and the resistor R4 is Z3, impedance of the parallel circuit of the condenser C3 and the resistor R3 is Z4, a voltage inputted to the condenser C2 is V1, and a voltage inputted to the condenser C4 is V2, then the output signal E03 of the differential circuit 3 is expressed by Eq. (2) shown below:

$$E03 = \frac{Z2}{Z1}\left\{\frac{Z4(Z1+Z3)}{Z2(Z3+Z4)} \times V2 - V1\right\} \tag{2}$$

In this case, when a noise component En of a power source for operating the inverter 22 overlaps with an output from the inverter 22, a signal including the overlapped noise component En and the inverted transmission signal E02' is inputted to the ultrasonic vibrator 20, and the voltage V2=E02'+En. Further, outputted from the ultrasonic vibrator 20 is a signal V1 obtained by adding a reception signal Ein to a signal obtained by voltage-dividing the transmission signal E02' overlapped with the noise component En, V1=a×(E02'+En)+ Ein (where a is a voltage-dividing factor).

Herein, when the amplification degrees of the forward rotation side and the inverted side of the differential circuit 3 are set such that the noise component En of the power source and the inverted transmission signal E02' are negated by the differential circuit 3, only the reception signal Ein is outputted from the differential circuit 3 to the phase detection circuit 6. Therefore, the noise component En of the power source or the inverted transmission signal E02' is not included in the Doppler signals E1 and E2 outputted from the phase detection circuit 6 (i.e., the first and second mixer circuits 6A and 6B).

Thus, since it may be prevented that the noise component is amplified, the amplification factor of the first and second amplifying circuits 13A and 13B for amplifying the first and second Doppler signals E1 and E2, respectively, can be set to be at a higher value. Further, since the differential circuit 3 may amplify signals to some degree, a monitoring space of the moving object detecting apparatus can be extended or enlarged, and, as a result, a blind spot of the moving object detecting apparatus can be reduced.

In the differential circuit 3 having a circuit configuration as shown in FIG. 9, it is possible to provide a band pass filter having an ultrasonic frequency as a band pass frequency, and remove a harmonic component of the inverted transmission signal E02' formed as a pulse signal of a square wave and a low frequency component contained in a power noise of the power source for operating the inverter 22, by adjusting a time constant of the condensers C1 to C4 and the resistors R1 to R4. Further, as described above, since the noise component contained in the Doppler signals E1 and E2 outputted from the phase detection circuit 6 can be reduced, the amplification factors of the first and second amplifying circuits 13A and 13B which amplify the Doppler signals E1 and E2, respectively, may be set to be at a higher value. Accordingly, the monitoring space of the moving object detecting apparatus can be extended or enlarged, and a blind spot of the moving object detecting apparatus can be further reduced.

(Embodiment 5)

Embodiment 5 in accordance with the present invention will be explained with reference to FIGS. 10 and 11. A basic configuration and operation other than the transmitter/receiver 2 are the same as those of the moving object detecting apparatuses described in Embodiments 1 to 3, and a detailed description of the common parts will be omitted.

Figure 10:
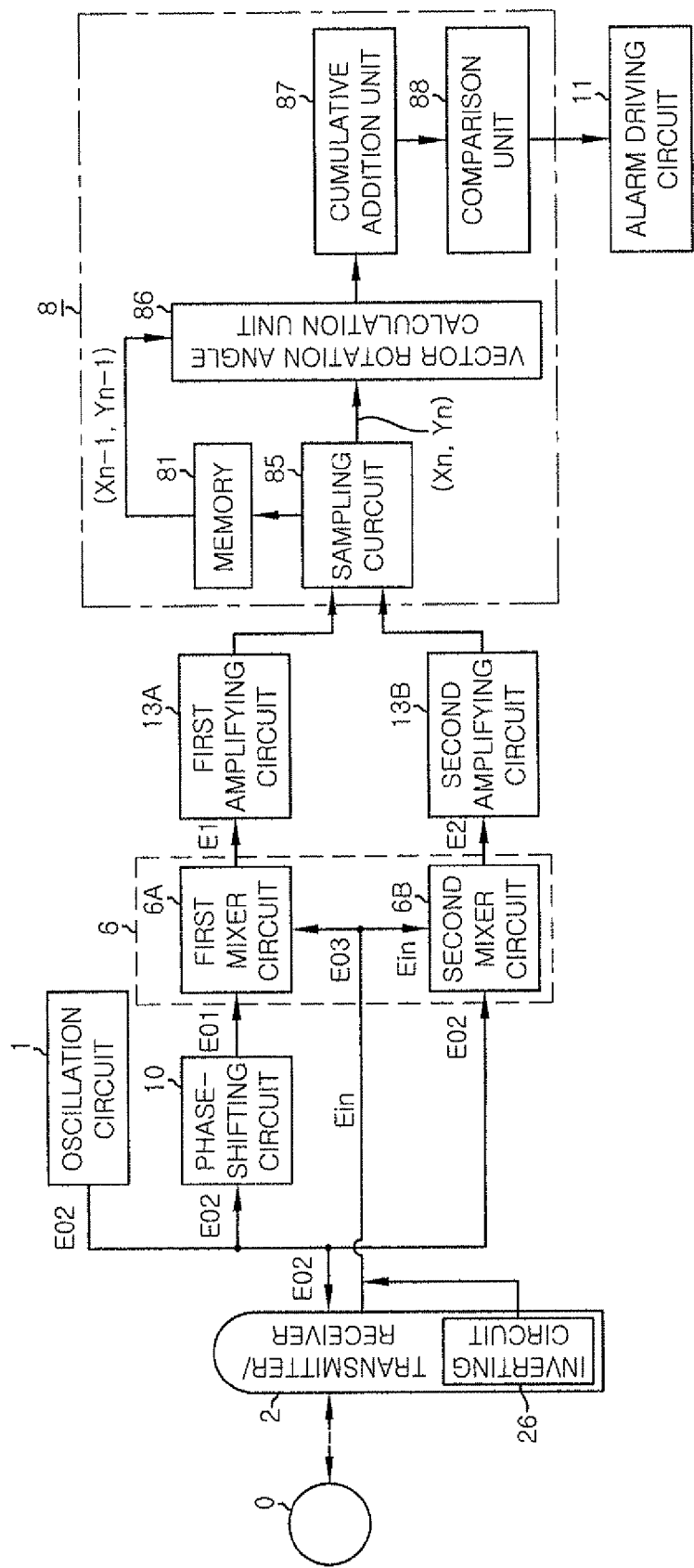
FIG. 10 is a block diagram representing a moving object detecting apparatus in accordance with a fifth embodiment of the present invention.

As shown in FIG. 10, the moving object detecting apparatus includes an oscillation circuit 1 (oscillation unit) for generating a pulse signal at a certain frequency; a transmitter/receiver 2 (transmitting/receiving unit) for transmitting ultrasonic waves based on a transmission signal E02 outputted from the oscillation circuit 1 to a monitoring space and receiving reflective waves from an object present in the monitoring space; and a phase-shifting circuit 10 for generating a reference signal E01 obtained by shifting the phase of the transmission signal E02.

Further, the moving object detecting apparatus includes a phase detection circuit 6 for mixing each of the reference signals E01 and E02 having a different phase from each other but the same frequency as that of the transmission signal E02 with a reception signal Ein outputted from the transmitter/receiver 2. The phase detection circuit 6 obtains a pair of Doppler signals E1 and E2 each having an amplitude depending on the phase difference from the reference signals E01 or E02 and a different phase from each other.

Besides, the moving object detecting apparatus includes first and second amplifying circuits 13A and 13B for amplifying the Doppler signals E1 and E2, respectively, and a signal processing unit 8 for determining the presence or absence of a moving object based on the Doppler signals E1 and E2 amplified by the amplifying circuits 13A and 13B.

The phase detection circuit 6 includes a first mixer circuit 6A for mixing the reference signal E01 obtained by shifting the phase of the transmission signal E02 while having the same frequency as that of the transmission signal E02 with the reception signal Ein, and a second mixer circuit 6B for mixing the transmission signal E02 as a reference signal with the reception signal Ein. In the present embodiment, the reference signal E01 is outputted from the phase-shifting circuit 10, such that the phase of the reference signal E01 is different from that of the reference signal E02 by a certain angle (e.g., 90 degrees). Thus, Doppler signals E1 and E2 outputted as bit signals from the first and second mixer circuits 6A and 6B also have different phases from each other. Further, the Doppler signals E1 and E2 are amplified by the amplifying circuits 13A and 13B, respectively, and then applied to the signal processing unit 8.

A detailed circuit diagram of each of the first and second mixer circuits 6A and 6B is same as shown in FIG. 3, and the operation in accordance with the present embodiment will now be described.

When a phase difference between the reference signal E01 or E02 and the reception signal Ein is $\pi$ (=180 degrees), a signal is outputted from the output terminal 61 during a period in which the reception signal Ein has a positive polarity with respect to the ground. In this case, when an amplitude of the reception signal Ein is A, a signal having a voltage level of $A/\pi$ is outputted from the output terminal 61.

Meanwhile, when a phase difference between the reference signal E01 or E02 and the reception signal Ein is 0 or $2n\pi$ (where n=1, 2, ... ), a signal is outputted from the output terminal 61 only during a period in which the reception signal Ein has a negative polarity with respect to the ground. Here, when the amplitude of the reception signal Ein is A, a signal having a voltage level of $-A/\pi$ is outputted from the output terminal 61.

Further, when a phase difference between the reference signal E01 or E02 and the reception signal Ein is neither $\pi$ nor $2n\pi$ (where n=0, 1, 2, ... ), a signal having a voltage level within a range of $-A/\pi \sim A/\pi$ is outputted from the output terminal 61. Namely, when the frequency of the reference signal E01 or E02 is different from that of the reception signal Ein, the Doppler signal E1 or E2 whose phase difference is changed within the range of $0 \sim 2\pi$ at a differential frequency is outputted from the output terminal 61.

In the present embodiment, the signal processing unit 8 includes a sampling circuit 85 for sampling at a certain period and quantizing the first and second Doppler signals E1 and E2 which have been amplified by the first and second amplifying circuits 13A and 13B. The sampling circuit 85 obtains values $X_n$ and $Y_n$ (n is an integer) by converting the Doppler signals E1 and E2 of analog values into the ones of digital values, respectively.

Further, the signal processing unit 8 includes a non-volatile memory 81 for sequentially storing the digital values X and Y which have been converted by the sampling circuit 85; and a vector rotation angle calculation unit 86 for obtaining a vector $R_n$ having the origin as a starting point and the point $(X_n, Y_n)$ as an ending point in a two-dimensional orthogonal coordinate system and sequentially storing it in the memory 81. The vector rotation angle calculation unit 86 calculates a rotation angle $\Phi_n$ between a vector $R_{n-1}$ obtained from immediately previous sampling and stored in the memory 81 and the vector $R_n$ obtained from the current sampling by using the Eq. (1).

Furthermore, the signal processing unit 8 includes a cumulative addition unit 87 for accumulating the vector rotation angle $\Phi_n$ calculated by the vector rotation angle calculation unit 86, and a comparison unit 88 for comparing the accumulated value $\Sigma\Phi_n$ calculated by the cumulative addition unit 87 with a threshold value. Alternatively, the signal processing unit 8 may be configured by using, for example, a microcomputer, and the microcomputer may execute a control program, thus realizing the vector rotation angle calculation unit 86, the cumulative addition unit 87, and the comparison unit 88.

As in the above-mentioned embodiments, when a moving object approaches to the moving object detecting apparatus, the vector $R_n$ rotates counterclockwise, such that the vector rotation angle $\Phi_n$ has a positive polarity. On the contrary, when the moving object moves away from the detecting apparatus, the vector $R_n$ rotates clockwise, and the vector rotation angle has a negative polarity. Further, the vector rotation angle $\Phi_n$ is accumulated by the cumulative addition unit 87, and the accumulated value ($=\Phi_1+\Phi_2+\ldots+\Phi_n \ldots$) is proportional to a movement distance of the moving object.

Thus, when the accumulated value $\Sigma\Phi_n$ exceeds a threshold value, the comparison unit 88 outputs an object detection signal. The object detection signal is inputted to an alarm driving circuit 11, and the alarm driving circuit 11 notifies about the presence of the moving object by driving an alarm (not shown) such as a lamp, a buzzer or the like.

Figure 11:
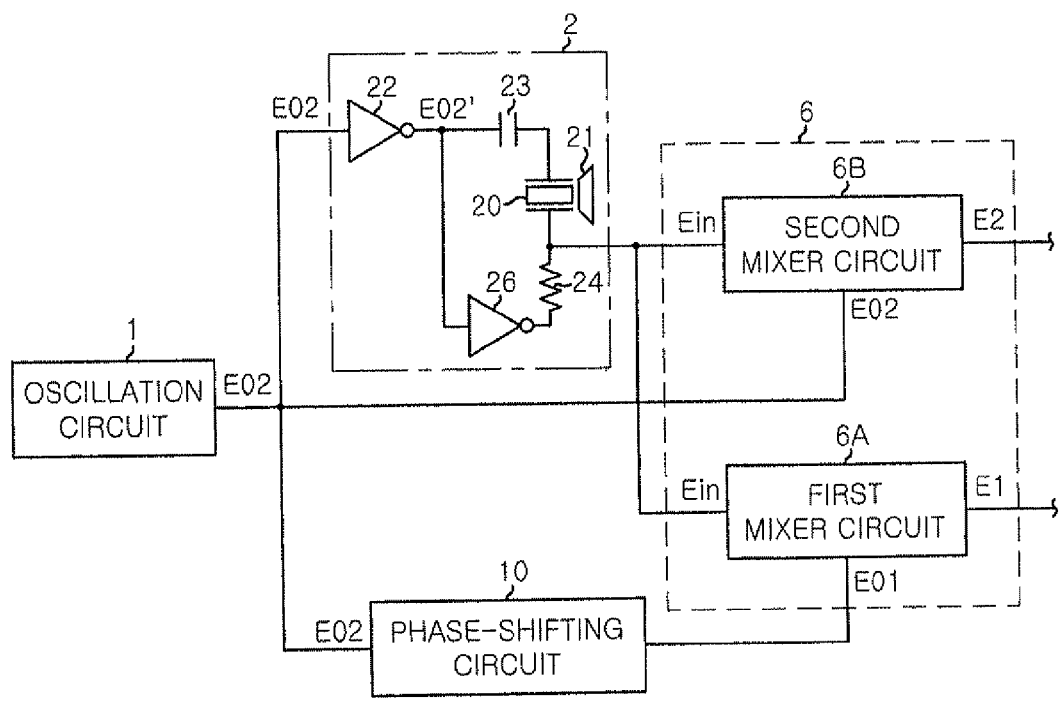
FIG. 11 is a detailed circuit diagram of parts of the moving object detecting apparatus in accordance with the fifth embodiment of the present invention.

As shown in FIG. 11, the transmitter/receiver 2 includes a single ultrasonic vibrator 20 common to transmission and reception and configured by using, for example, a piezoelectric element; a horn 21 for regulating a transmission direction and a reception direction of ultrasonic waves; and a gate IC 22 as an inverter for inverting high/low of the transmission signal E02 outputted from the oscillation circuit 1 and outputting the inverted transmission signal E02'. Further, the transmitter/receiver 2 includes a condenser 23, for cutting a DC off, connected between an output terminal of the gate IC 22 and the ultrasonic vibrator 20; an inverter (inverting circuit) 26 driven by the same power source as that of the gate IC, for inverting a signal from the gate IC 22; and a resistor 24 having the same impedance as that of the serial circuit of the condenser 23 and the ultrasonic vibrator 20 at the frequency of the transmission signal E02 and serving as an impedance element connected between the output terminal of the reception signal of the ultrasonic vibrator 20 and the output terminal of the inverter 26.

In the present embodiment, although the gate IC 22 as an inverter is used to drive the ultrasonic vibrator 20, a gate IC such as a buffer or the like may be used so long as it can invert an output into a high or low level depending on a level difference between the transmission signal E02 from the oscillation circuit 1 and a threshold level and supply a driving current to the ultrasonic vibrator 20.

In operation, when an output of the gate IC 22 has a high level, the output of the inverter 26 has a low level and the transmission signal E02' (signal obtained by inverting the transmission signal E02) overlapped with a noise component of the power source is voltage-divided by the serial circuit of the condenser 23 and the ultrasonic vibrator 20, and the resistor 24, such that a voltage-divided signal is outputted from an output terminal of the ultrasonic vibrator 20. On the other hand, when the output of the gate ICC 22 has a low level, the output of the inverter 26 has a high level and, accordingly, a noise component of the power source overlapped with the signal (i.e., transmission signal E02) obtained by inverting the inverted transmission signal E02' is voltage-divided by the resistor 24, and the serial circuit of the condenser 23 and the ultrasonic vibrator 20, such that the voltage-divided signal is outputted from the output terminal of the ultrasonic vibrator 20.

In the present embodiment, since an impedance of the serial circuit including the condenser 23 and the ultrasonic vibrator 20 is set to be the same impedance of the resistor at the frequency of the transmission signal E02, the transmission signal E02 can be negated at the output terminal of the ultrasonic vibrator 20. Further, the polarity of the voltage-divided noise component outputted from the output terminal of the ultrasonic vibrator 20 switches between positive and negative at a frequency (about 40 kHz) of the transmission signal E02. Therefore, when a Doppler frequency of about 100 Hz caused by a human movement is detected, the voltage obtained by voltage-dividing the noise component can be considered to have been negated.

Thus, the noise component of the power source included in the pair of Doppler signals E1 and E2 outputted from the phase detection circuit 6 can be reduced. Accordingly, since the amplification factor of the first and second amplifying circuits 13A and 13B for amplifying the Doppler signals E1 and E2 can be set to have a higher value, and a monitoring space of the moving object detecting apparatus can be extended or enlarged. As a result, a blind spot of the moving object detecting apparatus can be reduced.

Figure 18A:
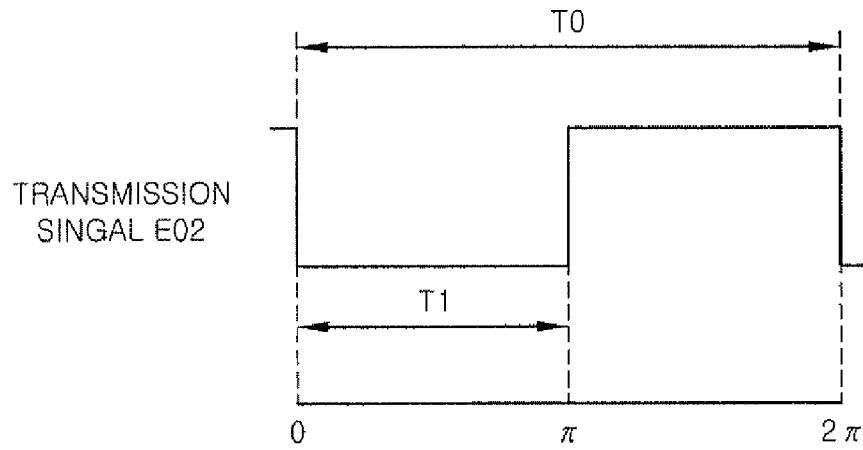
FIGS. 18A to 18C are waveforms of principal parts of the conventional moving object detecting apparatus.
Figure 18B:
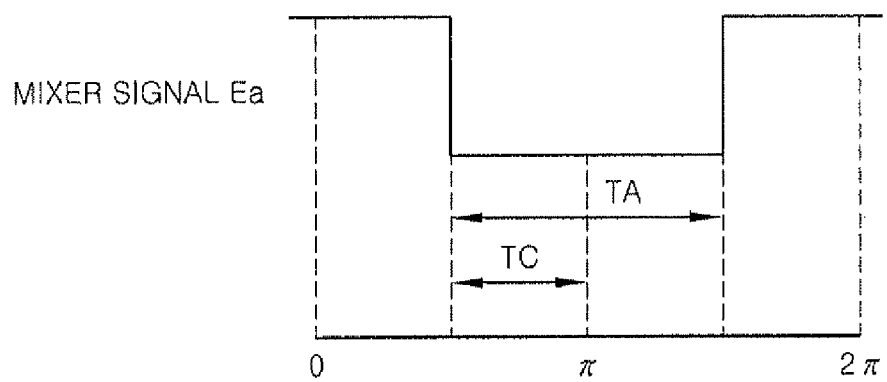

In the above-described moving object detecting apparatus, when a duty ratio of the transmission signal E02 becomes 50%, driving power is supplied to an ultrasonic vibrator during a period T1 which is half of one period T0. One reference signal is a signal E01 obtained by shifting the phase of the transmission signal E02 by 90 degrees and the other reference signal is an in-phase signal with the transmission signal E02. Thus, a period TA during which a reception signal is outputted from the first mixer circuit 6A overlaps only by a period TC corresponding to ¼ period (90-degree phase angle) with a period T1 during which a driving power is supplied to the ultrasonic vibrator (see FIG. 18B). Further, a period TB during which a reception signal is outputted from the second mixer circuit 6B is equal to the period T1 during which the driving power is supplied to the ultrasonic vibrator.

In this case, when a noise component is included in a power source of an inverter for driving the ultrasonic vibrator, the noise component overlaps with transmission signal during the period T1 in which the driving power is supplied to the ultrasonic vibrator. Further, since the ultrasonic vibrator is commonly used in transmission and reception, a signal in which a reception signal is added to the noise component-overlapping transmission signal is outputted from the ultrasonic vibrator during the period T1.

Figure 18C:
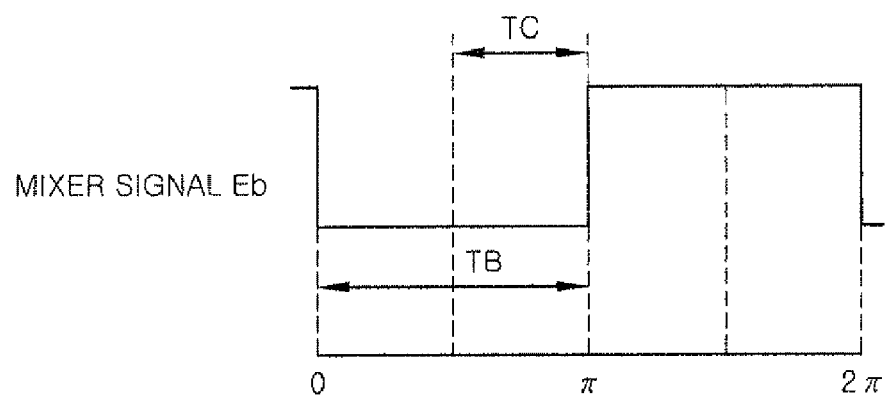

Thus, there is included the transmission signal overlapped with the noise component of the power source in the signal outputted from the first mixer circuit 6A during the period TC and the signal outputted from the second mixer circuit 6B during the period TB (=T1) (see FIG. 18C). Accordingly, when outputs from the mixer circuits 6A and 6B are amplified by the amplifying circuits 13A and 13B, the noise components are also amplified together. For that reason, the amplification factor of the first and second amplifying circuits 13A and 13B cannot be set to be high and a wide monitoring space cannot be secured. These problems are solved as will be described hereinafter.

(Embodiment 6)

Embodiment 6 in accordance with the present invention will be explained with reference to FIGS. 12 to 16C. In the present invention, a basic configuration and operation of the moving object detecting apparatus are the same as those of the moving object detecting apparatus described in Embodiments 1 to 3, and a detailed description of the common parts will be omitted.

Figure 12:
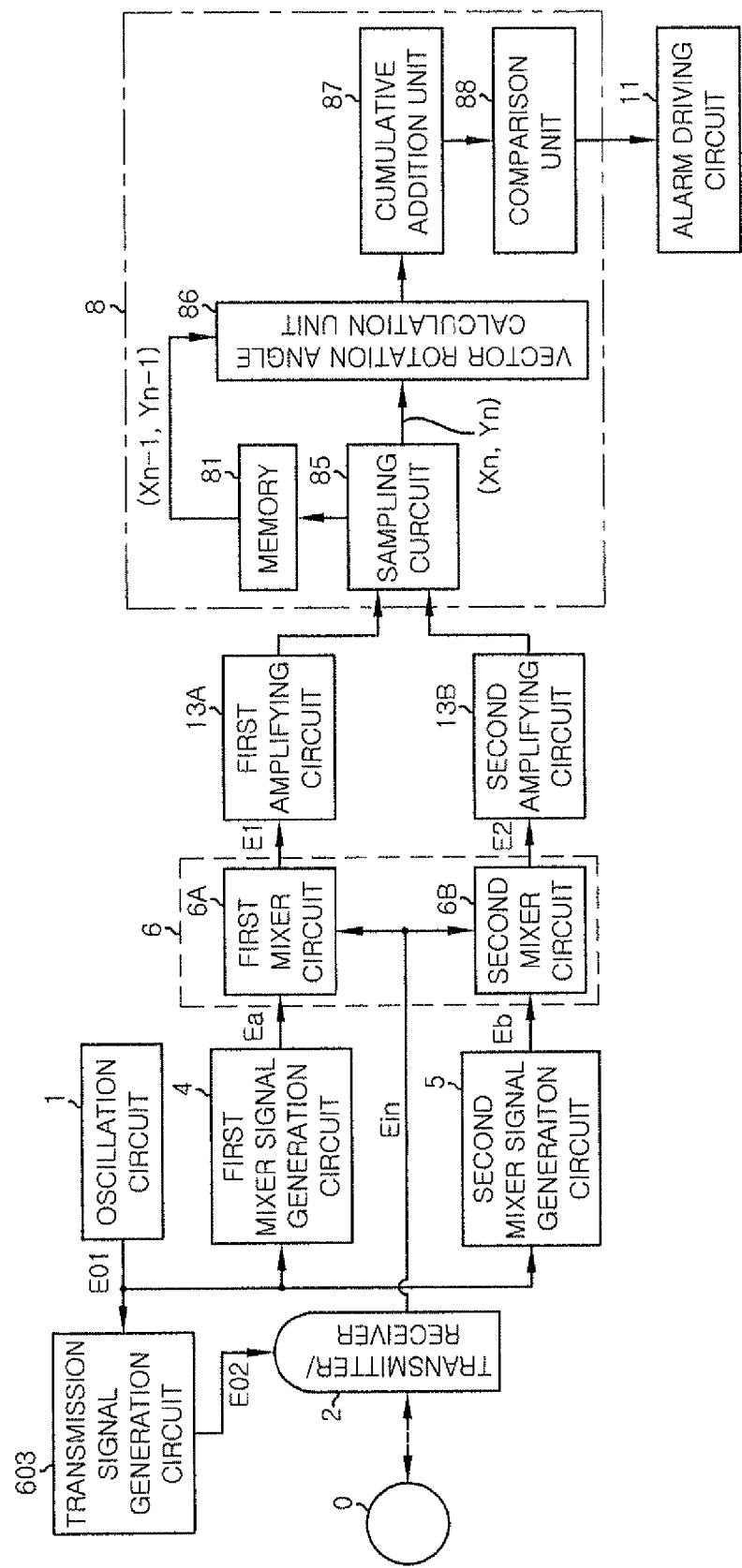
FIG. 12 is a block diagram showing a moving object detecting apparatus in accordance with a sixth embodiment of the present invention.

As shown in FIG. 12, the moving object detecting apparatus includes an oscillation circuit 1 (oscillation unit) for generating a pulse signal at a certain frequency; a transmission signal generation circuit 603 for demultiplying an oscillation signal E01 outputted from the oscillation circuit 1 and generating a transmission signal E02; and a transmitter/receiver 2 (transmitting/receiving unit) for radiating ultrasonic waves to a monitoring space upon receiving a driving power during a period in which the transmission signal E02 is inputted, and receiving reflective waves reflected from an object present in the monitoring space to convert the received reflective waves into an electrical signal.

Further, the moving object detecting apparatus includes a first mixer signal generation circuit 4 for generating a reference signal (mixer signal) Ea having a different phase from that of the transmission signal E02 and the same frequency as that of the transmission signal E02 by, e.g., demultiplying the oscillation signal E01 outputted from the oscillation circuit 1; a second mixer signal generation circuit 5 for generating a reference signal (mixer signal) Eb having a different phase from those of the transmission signal E02 and the reference signal Ea and the same frequency as that of the transmission signal E02 by e.g., demultiplying the oscillation signal E01 outputted from the oscillation circuit 1; and a phase detection circuit 6 for mixing the reception signal Ein outputted from the transmitter/receiver 2 with the reference signals Ea and Eb, respectively, to obtain a pair of Doppler signals E1 and E2 having a different phase from each other, each having an amplitude depending on the phase difference from the reference signals Ea or Eb.

Besides, the moving object detecting apparatus includes first and second amplifying circuits 13A and 13B amplifying the Doppler signals E1 and E2, respectively, and a signal processing unit 8 for determining the presence or absence of a moving object based on the Doppler signals E1 and E2 amplified by the amplifying circuits 13A and 13B. In the present embodiment, there is provided a mixer signal generation unit including two mixer signal generation circuits 4 and 5, thereby generating a pair of reference signals Ea and Eb having the same frequency as that of the transmission signal E02 and having different phases from each other by $\pi/2$.

Figure 13:
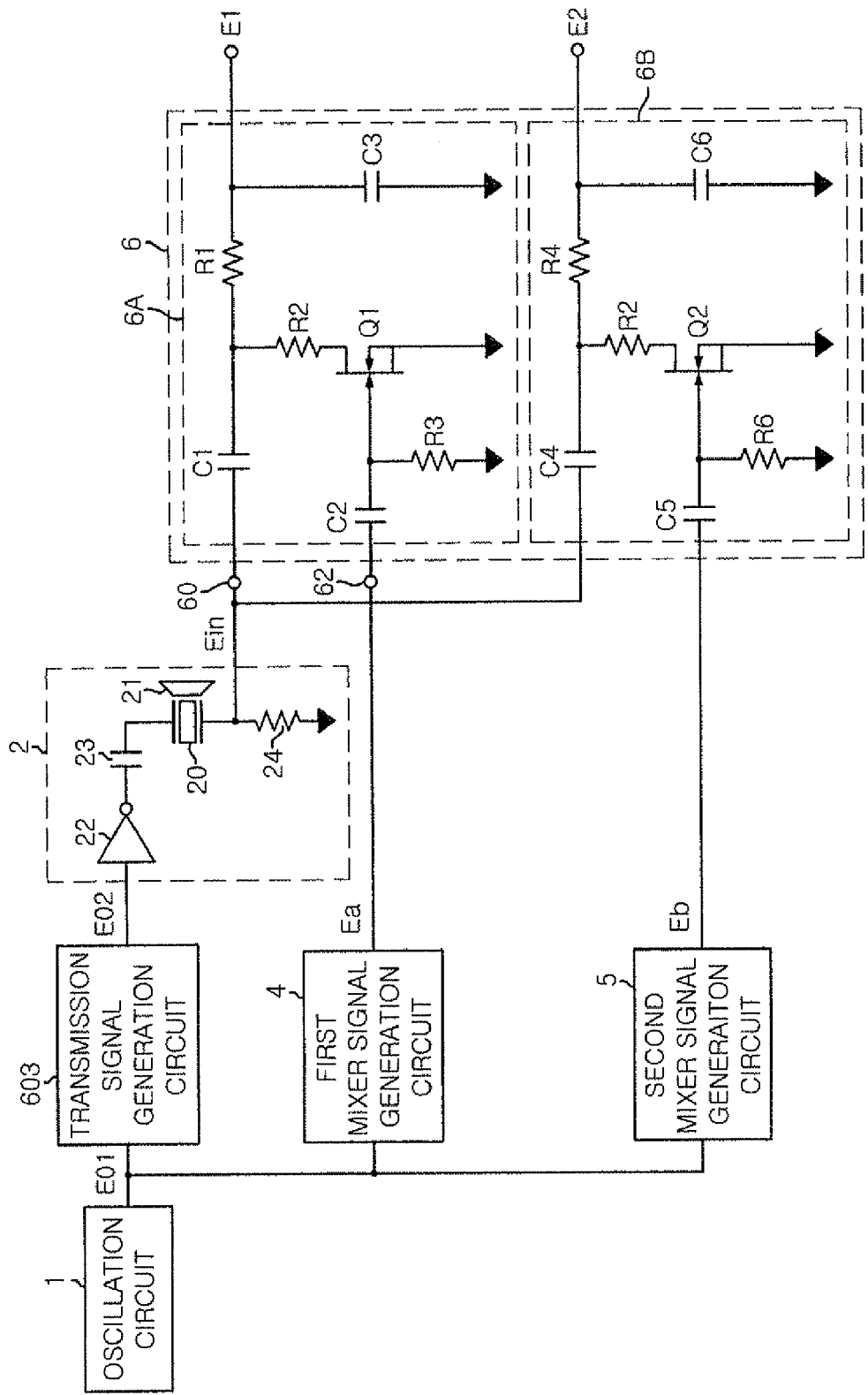
FIG. 13 is a detailed circuit diagram of principal parts of the moving object detecting apparatus in accordance with the sixth embodiment of the present invention.

As shown in FIG. 13, the transmitter/receiver 2 includes a single ultrasonic vibrator 20 common to transmission and reception and configured by using, e.g., a piezoelectric element; a horn 21 for regulating a transmission direction and a reception direction of ultrasonic waves; and an inverter 22 for outputting a signal obtained by inverting high/low of the transmission signal E02 outputted from the transmission signal generation circuit 603. Further, the transmitter/receiver 2 includes a condenser 23, for cutting a DC off, connected between an output terminal of the inverter 22 and the ultrasonic vibrator 20, and a resistor 24 connected between an output terminal of the ultrasonic vibrator 20 and the ground.

As mentioned above, the phase detection circuit 6 includes two mixer circuits 6A and 68. The first mixer circuit 6A mixes the reference signal Ea having the same frequency as that of the transmission signal E02 and a phase shifted from that of the transmission signal E02, with the reception signal Ein and outputs a Doppler signal E1 having an amplitude depending on the phase difference from the reference signal Ea. The second mixer circuit 68 mixes the reference signal Eb having the same frequency as that of the transmission signal E02 and a different phase from those of the transmission signal E02 and the reference signal Ea with the reception signal Ein, and outputs a Doppler signal E2 having an amplitude depending on the phase difference from the reference signal Eb.

Since the first and second mixer signal generation circuits 4 and 5 generate the reference signals Ea and Eb having phases shifted from each other by 90 degrees, the Doppler signals E1 and E2 obtained as bit signals from the outputs of the first and second mixer circuits 6A and 6B have also different phases from each other. Further, the Doppler signals E1 and E2 are respectively amplified by the amplifying circuits 13A and 13B and then applied to the signal processing unit 8.

As shown in FIG. 13, since the first and second mixer circuits 6A and 6B have the same circuit configuration, one mixer circuit 6A will be described and a description of the other mixer circuit 6B will be omitted.

The mixer circuit 6A includes an input terminal 60 to which the reception signal Ein from the ultrasonic vibrator 20 is inputted, an output terminal 61 from which the Doppler signal E1 is outputted, and a reference signal input terminal 62 to which the reference signal Ea is inputted from the first mixer signal generation circuit 4. Further, the mixer circuit 6A includes an FET Q1 having a drain and a source inserted between a signal line connecting the input terminal 60 and the output terminal 61 and the ground and having a gate to which the reference signal input terminal 62 is connected.

Further, condensers C1 and C2 for cutting a DC off are connected with the input terminal 60 and the reference signal input terminal 62, respectively. Besides, a resistor R3 for discharging is connected between the gate of the FET Q1 and the ground, and a resistor R2 is connected to the drain of the FET Q1. Furthermore, a low pass filter including an integration circuit of the resistor R1 and a condenser C3 is connected between the FET Q1 and the output terminal 61.

During a period in which the reference signal Ea inputted to the reference signal input terminal 62 is greater than a threshold value, the FET Q1 is turned on and the signal line between the input terminal 60 and the output terminal 61 is short-circuited, such that the Doppler signal E1 is not outputted from the output terminal 61. On the other hand, during a period in which the reference signal Ea is below the threshold value, the FET Q1 is turned off and the signal line between the input terminal 60 and the output terminal 61 is not short-circuited, such that the Doppler signal E1 is outputted from the output terminal 61.

In operation of the mixer circuits 6A and 6B, when a phase difference between the reference signal Ea or Eb and the reception signal Ein is $\pi$ (=180 degrees), a signal is outputted from the output terminal 61 only during the period in which the reception signal Fin has a positive polarity with respect to the ground. In this case, when the amplitude of the reception signal Ein is A, a signal having a voltage level of $A/\pi$ is outputted from the output terminal 61. Meanwhile, when a phase difference between the reference signal Ea or Eb and the reception signal Ein is 0 or $2n\pi$ (where n=1, 2, ... ), a signal is outputted from the output terminal 61 only during a period in which the reception signal Ein has a negative polarity with respect to the ground. In this case, when the amplitude of the reception signal Ein is A, a signal having a voltage level of $-A/\pi$ is outputted from the output terminal 61.

Further, in other cases than the case in which the phase difference between the reference signal Ea or Eb and the reception signal Ein is $\pi$ or $2n\pi$ (where n=0, 1, 2, ... ), a signal having a voltage level within a range of $-A/\pi \sim A/\pi$ is outputted from the output terminal 61. Namely, when the frequency of the reference signal Ea or Eb is different from that of the reception signal Fin, the Doppler signal E1 or E2 whose phase difference changes within a range of $0 \sim 2\pi$ at a differential frequency is outputted from the output terminal 61.

In the present embodiment, the signal processing unit 8 includes a sampling circuit 85 for sampling and quantizing the first and second Doppler signals E1 and E2 amplified by the first and second amplifying circuits 13A and 13B at a certain period to thereby obtain digital values $X_n$ and $Y_n$ (where n is a positive integer), wherein the sampling circuit 85 converts the Doppler signals E1 and E2 of analog values into the ones of digital values. The signal processing unit 8 includes a non-volatile memory 81 for sequentially storing the digital values X and Y converted by the sampling circuit 85; and a vector rotation angle calculation unit 86 for obtaining a vector $R_n$ having the origin as a starting point and the point $(X_n, Y_n)$ as an ending point in a two-dimensional orthogonal coordinate system and sequentially storing it in the memory 81, and calculating a vector rotation angle $\Phi_n$ between a vector $R_{n-1}$ obtained from immediately previous sampling and stored in the memory 81 and the vector $R_n$ obtained from the current sampling by using the foregoing Eq. (1).

Further, the signal processing unit 8 includes a rotation angle integration unit 87 (integration unit) for accumulating the vector rotation angle $\Phi_n$ calculated by the vector rotation angle calculation unit 86, and a comparison unit 88 for comparing the accumulated value $\Sigma\Phi_n$ added up by the rotation angle integration unit 87 with a threshold value. For example, the signal processing unit 8 may be configured by using a microcomputer, and the microcomputer may, by executing control programs, realize the vector rotation angle calculation unit 86, the rotation angle integration unit 87, and the comparison unit 88.

In operation, when a moving object approaches the moving object detecting apparatus, the vector $R_n$ rotates counterclockwise, such that the vector rotation angle $\phi n$ has a positive polarity. On the contrary, when the moving object moves away from the detecting apparatus, the vector $R_n$ rotates clockwise, such that the vector rotation angle has a negative polarity. Further, the vector rotation angle $\Phi_n$ is accumulated by the rotation angle integration unit 87, wherein the accumulated value ($=\Phi_1+\Phi_2+\ldots+\Phi_n+\ldots$) is proportional to a movement distance of the moving object.

Thus, when the accumulated value $\Sigma\Phi_n$ exceeds a threshold value, the comparison unit 88 outputs an object detection signal. The object detection signal is inputted to an alarm driving circuit 11, and the alarm driving circuit 11 notifies about the presence of the moving object by driving an alarm (not shown) such as a lamp, a buzzer or the like.

Figure 14A:
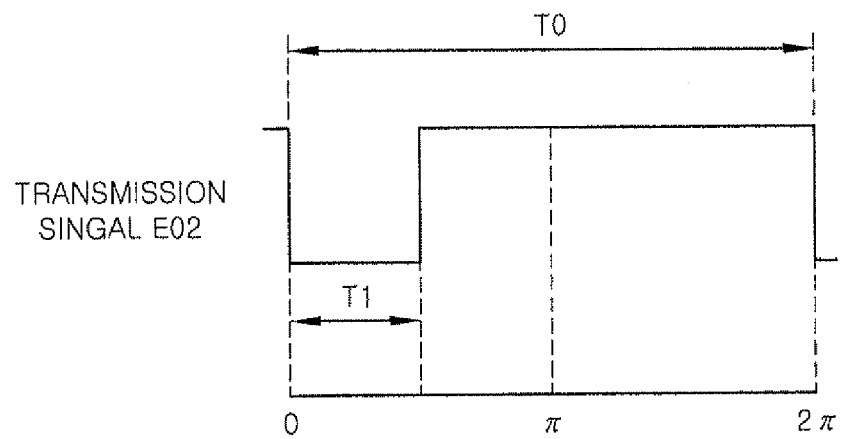
FIGS. 14A to 14C show waveforms of principal parts of the moving object detecting apparatus in accordance with the sixth embodiment of the present invention.
Figure 14B:
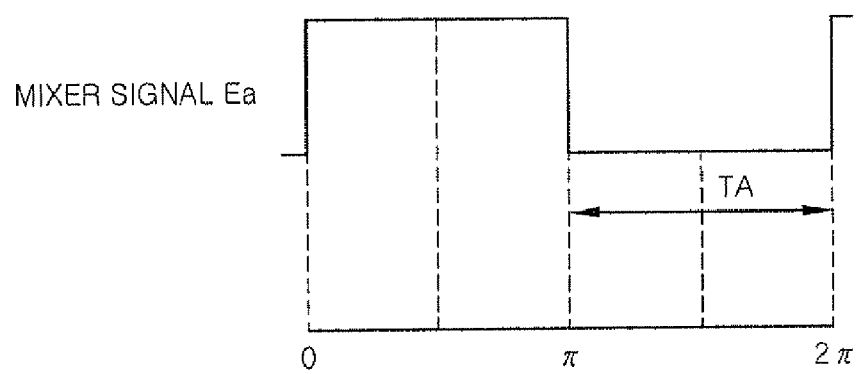
Figure 14C:
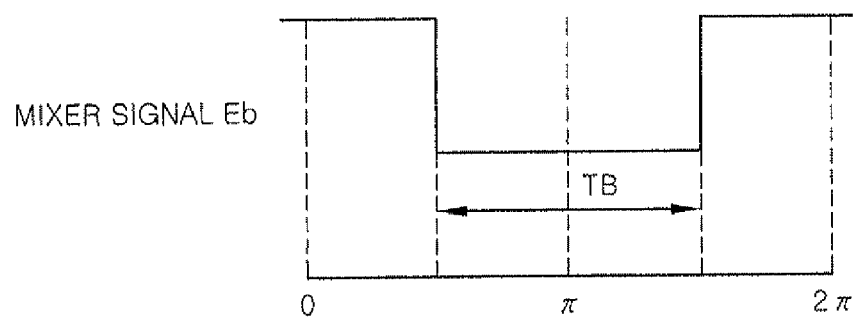

FIG. 14A shows the transmission signal E02 outputted from the transmission signal generation circuit 603, and FIGS. 14B and 14C show the reference signals Ea and Eb outputted from the first and second mixer signal generation circuits 4 and 5, respectively. The transmission signal E02 is outputted from the transmission signal generation circuit 603 during a period T1 in which a phase angle ranges from 0 to $\pi/2$ within one period T0 of ultrasonic wave. The reference signal Ea outputted from the mixer signal generation circuit 4 has an L level (lower than a threshold value) during a period TA in which the phase angle ranges from $\pi$ to $2\pi$ within the one period, the reference signal Eb outputted from the mixer signal generation circuit 5 has an L level (lower than a threshold value) during a period TB in which the phase angle ranges from $\pi/2$ to $(3/2)\pi$ within the one period. The phases of the reference signals Ea and Eb are different by 90 degrees ($\pi/2$) from each other.

As the above, since each of the transmission signal E02 and the reference signals Ea and Eb has a different phase from each other, there does not occur overlapping among the period T1 during which a driving power is supplied to the transmitter/receiver 2 by the transmission signal E02, and the periods TA and TB during which the reception signal Ein is mixed with the reference signals Ea and Eb by the mixer circuits 6A and 6B, respectively, and outputted therefrom, on the time axis.

Meanwhile, during the period T1, the driving power is supplied to the ultrasonic vibrator 20 based on the transmission signal E02. During this period, if a noise component $E_n$ of a power source for driving the inverter 22 overlaps with the output of the inverter 22, the signal in which the noise component En overlaps with the transmission signal E02 is inputted to the ultrasonic vibrator 20. Further, during the period T1,  the noise component $E_n$ of the power source overlaps also with the reception signal Ein outputted from the ultrasonic vibrator 20.

However, since the driving power is not supplied to the ultrasonic vibrator 20 during the remaining period within the period T0, it does not happen that the noise component En of the power source overlaps with the reception signal Ein outputted from the ultrasonic vibrator 20. That is, in the present embodiment, the phases of the transmission signal E02 and the reference signals Ea and Eb are shifted from each other such that the period T1 during which the driving power is supplied to the transmitter/receiver 2 based on the transmission signal E02 and the periods TA and TB during which the reception signal Ein is outputted from the mixer circuits 6A and 6B do not overlap on the time axis.

Therefore, it does not happen that the noise component En is included in the first and second Doppler signals E1 and E2 outputted from the mixer circuits 6A and 6B. Thus, since it does not happen that the noise component En is not amplified by the first and second amplifying circuits 13A and 13B for amplifying the first and second Doppler circuits E1 and E2, respectively, the amplification factor of the first and second amplifying circuits 13A and 13B can be set to have a higher value. As a result, the monitoring space of the moving object detecting apparatus can be extended or enlarged, thereby reducing a blind spot of the moving object detecting apparatus.

In the example illustrated in FIGS. 14A to 14C, the period T1 during which the transmission signal E02 is outputted spreads over a range in which the phase angle ranges from 0 to $\pi/2$ within one period, and the voltage level of the reference signal Ea during the period TA in which the phase angle ranges from $\pi$ to $2\pi$ is L level and the voltage level of the reference signal Eb during the period TB in which the phase angle ranges from $\pi/2$ to $(3/2)\pi$ is L level. However, the transmission signal E02 and the reference signals Ea and Eb are not limited to the pattern shown in FIGS. 14A to 14C.

Figure 15A:
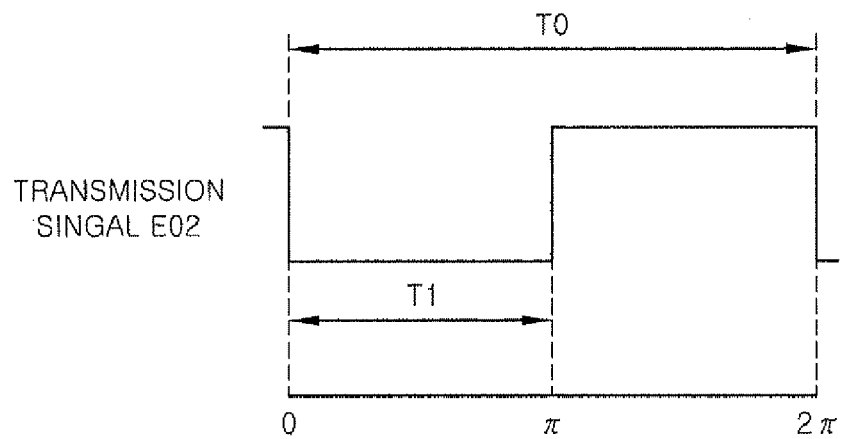
FIGS. 15A to 15C depict waveforms of principal parts of the moving object detecting apparatus in accordance with the sixth embodiment of the present invention.
Figure 15B:
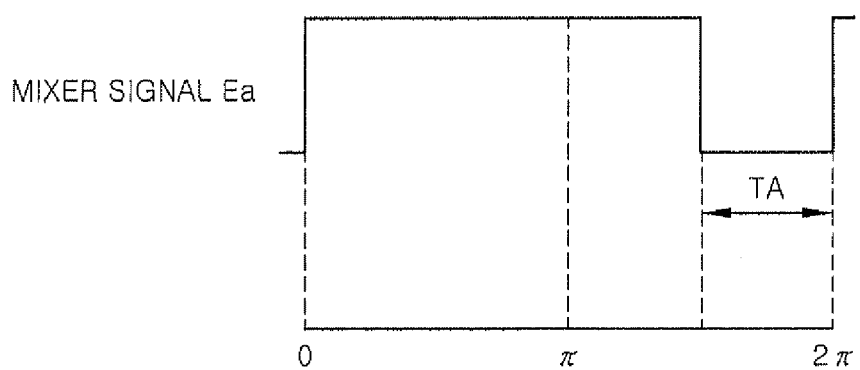
Figure 15C:
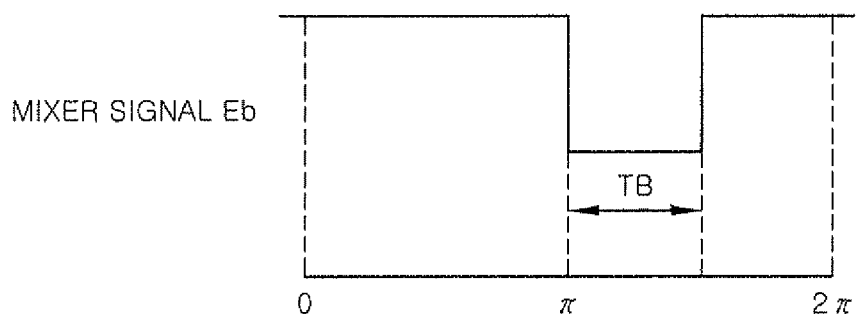
Figure 16A:
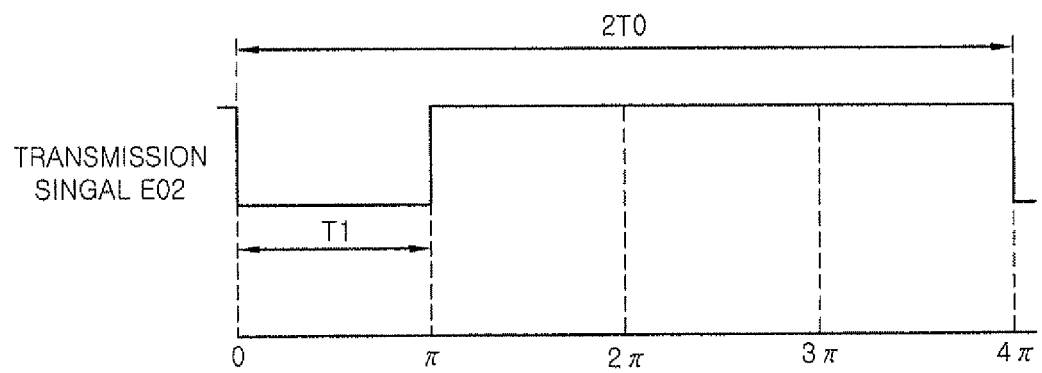
FIGS. 16A to 16C illustrate waveforms of principal parts of the moving object detecting apparatus in accordance with the sixth embodiment of the present invention.
Figure 16B:
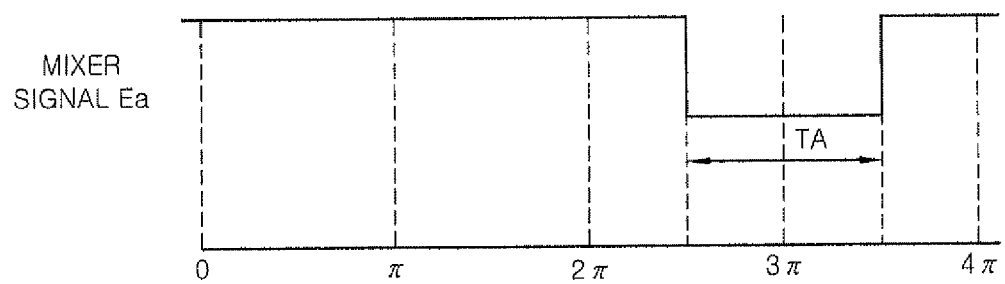
Figure 16C:
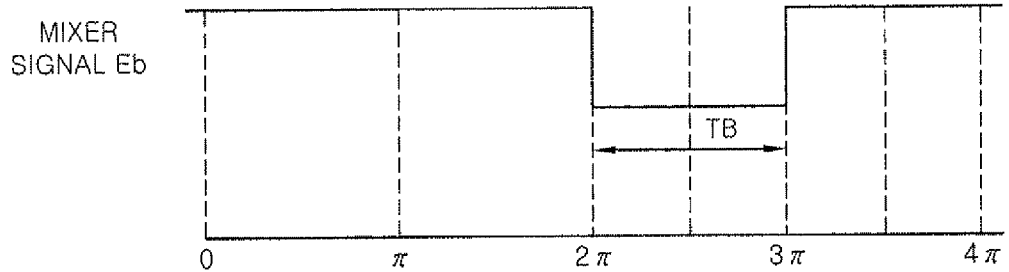

For example, as illustrated in FIGS. 15A to 15C, within one period T0 of ultrasonic wave, the period T1 during which the transmission signal E02 is outputted may range from 0 to $\pi$, and the voltage level of the reference signal Ea during the period TA in which the phase angle ranges from $(3/2)\pi$ to $2\pi$ may be L level and the voltage level of the reference signal Eb during the period TB in which the phase angle ranges from a to $(3/2)\pi$ may be L level. Alternatively, as illustrated in FIGS. 16A to 16C, within two periods 2T0 of ultrasonic wave, the period T1 during which the transmission signal E02 is outputted may range from 0 to $\pi$, and the voltage level of the reference signal Ea during the period TA in which the phase angle ranges from $(5/2)\pi$ to $(7/2)\pi$ may be L level and the voltage level of the reference signal Eb during the period TB in which the phase angle ranges from $2\pi$ to $3\pi$ may be L level.

While the invention has been shown and described with respect to the particular embodiments, it will be understood by those skilled in the art that various changes and modification may be made.

What is claimed is:

1. A moving object detecting apparatus, the apparatus comprising:
    an oscillation unit for oscillating at a certain frequency;
    a transmitting unit for radiating an ultrasonic wave based on a transmission signal outputted from the oscillation unit into a monitoring space;
    a receiving unit for receiving a reflective wave as a ultrasonic wave reflected from an object present in the monitoring space to output a reception signal;

a phase detection circuit for mixing reference signals each having the same frequency as that of the transmission signal and a different phase from that of the transmission signal with the reception signal and for obtaining a pair of Doppler signals each having an amplitude depending on a phase difference from the reference signal, each of the Doppler signals having a different phase from each other;

a rotation angle calculation unit for calculating a rotation angle at which a vector having the origin as a starting point and a numerical value of an amplitude level of the pair of Doppler signals as an ending point in a two-dimensional orthogonal coordinate system rotates with time;

a cumulative addition unit for accumulating the rotation angle calculated by the rotational angle calculation unit; and a comparison unit for comparing the accumulated value of the rotation angle accumulated by the cumulative addition unit with a threshold value, wherein a single ultrasonic vibrator is common to the transmitting unit and the receiving unit.

2. The apparatus of claim 1, wherein the phase detection unit includes:
an input terminal to which a reception signal is inputted;
an output terminal from which a Doppler signal is outputted;
a reference signal input terminal to which a reference signal is inputted; and
a field effect transistor (FET) inserted between a signal line connecting the input terminal and the output terminal and a ground, having a gate to which the reference signal input terminal is connected.

3. The apparatus of claim 1, wherein the phase detection unit includes:
a first detection block including an input terminal to which a reception signal is inputted, an output terminal from which a Doppler signal is outputted, a reference signal input terminal to which a reference signal is inputted, and a field effect transistor inserted between a signal line connecting the input terminal and the output terminal and a ground, having a gate to which the reference signal input terminal is connected;
a second detection block including an input terminal to which a reception signal is inputted, an output terminal from which a Doppler signal is outputted, a reference signal input terminal to which a reference signal is inputted, and a field effect transistor inserted between a signal line connecting the input terminal and the output terminal and a ground, having a gate to which the reference signal input terminal is connected through an inverter; and
a differential amplifier for differentially amplifying the Doppler signal outputted from the output terminal of the first detection block and the Doppler signal outputted from the output terminal of the second detection block.

4. The apparatus of claim 1, wherein the phase detection unit includes:
an input terminal to which a reception signal is inputted;
an output terminal from which a Doppler signal is outputted;
a reference signal input terminal to which a reference signal is inputted;
an operational amplifier having one input end connected to the ground during a positive period in which a potential of the reference signal input terminal has a positive polarity with respect to the ground, and connected to receive the reception signal during a negative period in which the potential of the reference signal input terminal has a negative polarity with respect to the ground;
an input resistor inserted between the input terminal and the one input end of the operational amplifier;
a feedback resistor inserted between an output end of the operational amplifier and the other input end of the operational amplifier; and
a low pass filter inserted between the output terminal and the output end of the operational amplifier.

5. The apparatus of claim 1, wherein the transmitting unit includes:
an inverter which inverts the transmission signal outputted from the oscillation unit; and
a serial circuit of a condenser and a resistor inserted between an output end of the inverter and one input end of the ultrasonic vibrator,
wherein the receiving unit obtains a reception signal from the one input end of the ultrasonic vibrator.

6. The apparatus of claim 2, wherein the transmitting unit includes:
an inverter which inverts the transmission signal outputted from the oscillation unit; and
a serial circuit of a condenser and a resistor inserted between an output end of the inverter and one input end of the ultrasonic vibrator,
wherein the receiving unit obtains a reception signal from the one input end of the ultrasonic vibrator.

7. The apparatus of claim 3, wherein the transmitting unit includes:
an inverter which inverts the transmission signal outputted from the oscillation unit; and
a serial circuit of a condenser and a resistor inserted between an output end of the inverter and one input end of the ultrasonic vibrator,
wherein the receiving unit obtains a reception signal from the one input end of the ultrasonic vibrator.

8. The apparatus of claim 4, wherein the transmitting unit includes:
an inverter which inverts the transmission signal outputted from the oscillation unit; and
a serial circuit of a condenser and a resistor inserted between an output end of the inverter and one input end of the ultrasonic vibrator,
wherein the receiving unit obtains a reception signal from the one input end of the ultrasonic vibrator.

9. The apparatus of claim 1, wherein the transmitting unit includes:
an inverter which inverts a transmission signal outputted from the oscillation unit;
a condenser inserted between an output end of the inverter and one input end of the ultrasonic vibrator; and
a resistor inserted between the other input end of the ultrasonic vibrator and the ground,
wherein the receiving unit obtains a reception signal from the other input end of the ultrasonic vibrator.

10. The apparatus of claim 2, wherein the transmitting unit includes:
an inverter which inverts a transmission signal outputted from the oscillation unit;
a condenser inserted between an output end of the inverter and one input end of the ultrasonic vibrator; and
a resistor inserted between the other input end of the ultrasonic vibrator and the ground,
wherein the receiving unit obtains a reception signal from the other input end of the ultrasonic vibrator.

11. The apparatus of claim 3, wherein the transmitting unit includes:
an inverter which inverts a transmission signal outputted from the oscillation unit;
a condenser inserted between an output end of the inverter and one input end of the ultrasonic vibrator; and
a resistor inserted between the other input end of the ultrasonic vibrator and the ground,
wherein the receiving unit obtains a reception signal from the other input end of the ultrasonic vibrator.

12. The apparatus of claim 4, wherein the transmitting unit includes:
an inverter which inverts a transmission signal outputted from the oscillation unit;
a condenser inserted between an output end of the inverter and one input end of the ultrasonic vibrator; and
a resistor inserted between the other input end of the ultrasonic vibrator and the ground,
wherein the receiving unit obtains a reception signal from the other input end of the ultrasonic vibrator.

13. The apparatus of claim 1, comprising:
a phase-shifting unit for generating a reference signal by shifting a phase of the transmission signal outputted from the oscillation unit.

14. The apparatus of claim 12, comprising:
a phase-shifting unit for generating a reference signal by shifting a phase of the transmission signal outputted from the oscillation unit.

15. The apparatus of claim 13, further comprising:
a buffer amplifier inserted between the receiving unit and the phase detection unit.

16. The apparatus of claim 14, further comprising:
a buffer amplifier inserted between the receiving unit and the phase detection unit.

17. The apparatus of claim 16, wherein the buffer amplifier has a function of a filter for allowing only a frequency of ultrasonic wave to pass therethrough.

18. A moving object detecting apparatus, the apparatus comprising:
an oscillation unit for oscillating at a certain frequency;
a transmitting/receiving unit for radiating an ultrasonic wave based on a transmission signal outputted from the oscillation unit into a monitoring space and receiving a reflective wave reflected from an object present in the monitoring space to output a reception signal;
a difference output unit for outputting a difference between a signal inputted to the transmitting/receiving unit and a signal outputted from the transmitting/receiving unit;
a phase detection unit which mixes reference signals each having a different phase from each other at the same frequency as that of the transmission signal with a signal outputted from the difference output unit and obtains a pair of Doppler signals each having an amplitude depending on a phase difference from the reference signal and a different phase from each other;
a rotation angle calculation unit for calculating a rotation angle at which a vector having the origin as a starting point and a numerical value of an amplitude level of the pair of Doppler signals as an ending point in a two-dimensional orthogonal coordinate system, rotates with time;
a cumulative addition unit for accumulating the rotation angle calculated by the rotational angle calculation unit; and
a comparison unit for comparing the accumulated value of the rotation angle accumulated by the cumulative addition unit with a threshold value.

19. A moving object detecting apparatus, the apparatus comprising:
an oscillation unit for oscillating at a certain frequency;
a transmitting/receiving unit for radiating an ultrasonic wave based on a transmission signal outputted from the oscillation unit into a monitoring space and receiving a reflective wave reflected from an object present in the monitoring space as a reception signal;
a phase detection unit which mixes reference signals each having a different phase from each other and the same frequency as that of the transmission signal with the reception signal and obtains a pair of Doppler signals each having an amplitude depending on a phase difference from the reference signal and a different phase from each other;
a rotation angle calculation unit for calculating a rotation angle at which a vector having the origin as a starting point and a numerical value of an amplitude level of the pair of Doppler signals as an ending point in a two-dimensional orthogonal coordinate system, rotates with time;
a cumulative addition unit which accumulates the rotation angle calculated by the rotational angle calculation unit; and
a comparison unit which compares the accumulated value of the rotation angle accumulatively added up by the cumulative addition unit with a threshold value,
wherein the transmitting/receiving unit includes a single ultrasonic vibrator common to transmission and reception; a gate IC which receives the transmission signal from the oscillation unit and inverts an output based on a level difference between the corresponding transmission signal and a threshold level; a condenser, for cutting a DC off, connected between an output end of the gate IC and the ultrasonic vibrator; an inverter driven by the same power as that of the gate IC, inverting an output from the gate IC; and an impedance element connected between an output end of the ultrasonic vibrator and an output end of the inverter, having the same impedance as that of a serial circuit of the condenser and the ultrasonic vibrator at a frequency of the transmission signal.

20. A moving object detecting apparatus, the apparatus comprising:
an oscillation unit which oscillates at a certain frequency;
a transmission signal generation unit for generating a transmission signal based on an oscillation output from the oscillation unit;
a transmitting/receiving unit for radiating an ultrasonic wave into a monitoring space, upon receiving driving power during a period in which the transmission signal is inputted, and receiving a reflective wave reflected from an object present in the monitoring space to convert the received reflective wave into an electrical signal;
a mixer signal generation unit which generates a pair of reference signals each having a different phase from each other and the same frequency as that of the transmission signal;
a phase detection unit which mixes the pair of reference signals generated by the mixer signal generation unit with the reception signal and obtains a pair of Doppler signals each having an amplitude depending on a phase difference from the reference signal and a different phase from each other;
a rotation angle calculation unit for calculating a rotation angle at which a vector having the origin as a starting point and a numerical value of an amplitude level of the pair of Doppler signals as an ending point in a two-dimensional orthogonal coordinate system, rotates with time;

a cumulative addition unit for accumulating the rotation angle calculated by the rotational angle calculation unit; and a comparison unit which compares the accumulated value of the rotation angle accumulatively added up by the cumulative addition unit with a threshold value, wherein the transmission signal generation unit and the mixer signal generation unit shift phases of the transmission signal and the reception signal, such that a period during which driving power is supplied to the transmitting/receiving unit based on the transmission signal, and periods during which the reception signal is mixed with the reference signals by the phase detection unit and outputted do not overlap on the time axis.

* * * * *